United States Patent
Watanabe et al.

(10) Patent No.: US 12,219,857 B2
(45) Date of Patent: Feb. 4, 2025

(54) DISPLAY APPARATUS, DISPLAY MODULE, AND ELECTRONIC DEVICE

(71) Applicant: SEMICONDUCTOR ENERGY LABORATORY CO., LTD., Atsugi (JP)

(72) Inventors: Kazunori Watanabe, Tokyo (JP); Koji Kusunoki, Kanagawa (JP); Susumu Kawashima, Kanagawa (JP); Taisuke Kamada, Saitama (JP); Ryo Hatsumi, Kanagawa (JP); Daisuke Kubota, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 515 days.

(21) Appl. No.: 17/623,798

(22) PCT Filed: Jun. 23, 2020

(86) PCT No.: PCT/IB2020/055891
§ 371 (c)(1),
(2) Date: Dec. 29, 2021

(87) PCT Pub. No.: WO2021/005434
PCT Pub. Date: Jan. 14, 2021

(65) Prior Publication Data
US 2022/0246694 A1    Aug. 4, 2022

(30) Foreign Application Priority Data
Jul. 5, 2019   (JP) .................................. 2019-126333

(51) Int. Cl.
*H10K 59/65*  (2023.01)
*G06F 3/042*  (2006.01)
(Continued)

(52) U.S. Cl.
CPC ............. *H10K 59/65* (2023.02); *H10K 30/82* (2023.02); *H10K 50/828* (2023.02);
(Continued)

(58) Field of Classification Search
CPC ...... H10K 59/65; H10K 59/40; H10K 59/122; H10K 59/38; H10K 50/865; H10K 50/828;
(Continued)

(56) References Cited

U.S. PATENT DOCUMENTS

| | | | |
|---|---|---|---|
| 8,728,838 B2 | 5/2014 | Takahara | |
| 9,088,006 B2 | 7/2015 | Yamazaki et al. | |

(Continued)

FOREIGN PATENT DOCUMENTS

| | | | |
|---|---|---|---|
| CN | 103022072 A | 4/2013 | |
| CN | 104157665 A | 11/2014 | |

(Continued)

OTHER PUBLICATIONS

International Search Report (Application No. PCT/IB2020/055891), dated Oct. 13, 2020.
(Continued)

*Primary Examiner* — Mohsen Ahmadi
(74) *Attorney, Agent, or Firm* — Fish & Richardson P.C.

(57) ABSTRACT

A display apparatus having a photosensing function is provided. The display apparatus includes a first pixel circuit and a second pixel circuit. The first pixel circuit includes a light-receiving device, a first transistor, and a second transistor. The second pixel circuit includes a light-emitting device. The light-receiving device includes a first pixel electrode, an active layer, and a common electrode. The light-emitting device includes a second pixel electrode, a light-emitting layer, and the common electrode. The active layer is positioned over the first pixel electrode and includes
(Continued)

a first organic compound. The light-emitting layer is positioned over the second pixel electrode and includes a second organic compound different from the first organic compound. The common electrode includes a portion overlapping with the first pixel electrode with the active layer therebetween and a portion overlapping with the second pixel electrode with the light-emitting layer therebetween. The first transistor includes low-temperature polysilicon as a semiconductor layer and the second transistor includes a metal oxide as a semiconductor layer.

13 Claims, 22 Drawing Sheets

(51) Int. Cl.
    *H10K 30/40*     (2023.01)
    *H10K 30/82*     (2023.01)
    *H10K 39/30*     (2023.01)
    *H10K 50/828*     (2023.01)
    *H10K 50/86*     (2023.01)
    *H10K 59/122*     (2023.01)
    *H10K 59/38*     (2023.01)
    *H10K 59/40*     (2023.01)
    *G06F 3/041*     (2006.01)
    *H10K 102/00*     (2023.01)

(52) U.S. Cl.
    CPC ........... *H10K 50/865* (2023.02); *H10K 59/40* (2023.02); *G06F 3/0412* (2013.01); *G06F 3/0421* (2013.01); *H10K 30/40* (2023.02); *H10K 59/122* (2023.02); *H10K 59/38* (2023.02); *H10K 2102/311* (2023.02)

(58) Field of Classification Search
CPC ... H10K 30/82; H10K 30/40; H10K 2102/311
See application file for complete search history.

(56) References Cited

U.S. PATENT DOCUMENTS

| | | | |
|---|---|---|---|
| 9,155,498 | B2 | 10/2015 | Akiyama |
| 9,167,994 | B2 | 10/2015 | Akiyama |
| 9,627,648 | B2 | 4/2017 | Yamazaki et al. |
| 10,003,047 | B2 | 6/2018 | Yamazaki et al. |
| 10,381,599 | B2 | 8/2019 | Yamazaki et al. |
| 10,903,453 | B2 | 1/2021 | Yamazaki et al. |
| 2009/0230392 | A1 | 9/2009 | Takahara |
| 2013/0075761 | A1 | 3/2013 | Akiyama |
| 2014/0350366 | A1 | 11/2014 | Akiyama |
| 2015/0249213 | A1* | 9/2015 | Fujita ................... H10K 85/322 257/40 |
| 2015/0295182 | A1* | 10/2015 | Fujita ................... H10K 85/636 257/40 |
| 2017/0141337 | A1* | 5/2017 | Hamade ................. H10K 50/11 |
| 2018/0261773 | A1* | 9/2018 | Yamamoto ........... H10K 85/636 |
| 2018/0269416 | A1* | 9/2018 | Hamade ................. G06V 10/143 |
| 2020/0395576 | A1 | 12/2020 | Yamazaki et al. |
| 2021/0005668 | A1 | 1/2021 | Trefonas, III et al. |
| 2021/0327979 | A1 | 10/2021 | Kamada et al. |
| 2022/0173174 | A1 | 6/2022 | Hatsumi et al. |

FOREIGN PATENT DOCUMENTS

| | | |
|---|---|---|
| CN | 104409475 A | 3/2015 |
| CN | 104681593 A | 6/2015 |
| CN | 109564976 A | 4/2019 |
| EP | 3433885 A | 1/2019 |
| JP | 2007-081203 A | 3/2007 |
| JP | 2009-224595 A | 10/2009 |
| JP | 2013-073965 A | 4/2013 |
| JP | 2014-197522 A | 10/2014 |
| JP | 2019-514200 | 5/2019 |
| KR | 2013-0033278 A | 4/2013 |
| KR | 2019-0028362 A | 3/2019 |
| TW | 201316495 | 4/2013 |
| TW | 201444321 | 11/2014 |
| TW | 201737511 | 10/2017 |
| WO | WO-2017/165592 | 9/2017 |
| WO | WO-2018/167835 | 9/2018 |

OTHER PUBLICATIONS

Written Opinion (Application No. PCT/IB2020/055891), dated Oct. 13, 2020.

\* cited by examiner

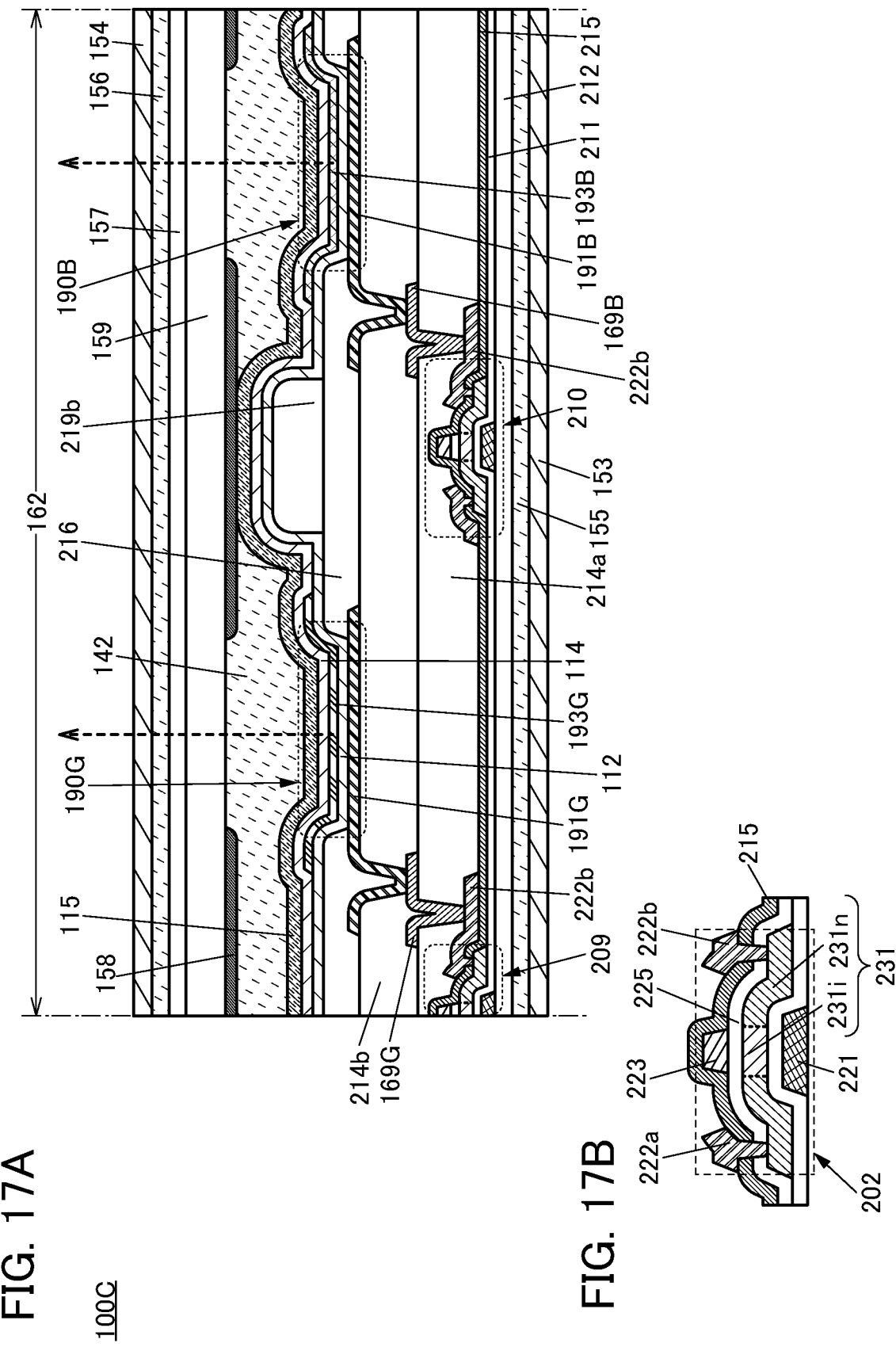

DISPLAY APPARATUS, DISPLAY MODULE, AND ELECTRONIC DEVICE

CROSS REFERENCE TO RELATED APPLICATIONS

This application is a U.S. National Phase Application under 35 U.S.C. § 371 of International Application PCT/IB2020/055891, filed on Jun. 23, 2020, which is incorporated by reference and claims the benefit of a foreign priority application filed in Japan on Jul. 5, 2019, as Application No. 2019-126333.

TECHNICAL FIELD

One embodiment of the present invention relates to a display apparatus, a display module, and an electronic device. One embodiment of the present invention relates to a display apparatus including a light-receiving device (also referred to as a light-receiving element) and a light-emitting device (also referred to as a light-emitting element).

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (such as a touch sensor), an input/output device (such as a touch panel), a method for driving any of them, and a method for manufacturing any of them.

BACKGROUND ART

Recent display apparatuses have been expected to be applied to a variety of uses. Examples of uses for large-size display apparatuses include television devices for home use (also referred to as a TV or a television receiver), digital signage, and PIDs (Public Information Display). In addition, smartphones and tablet terminals including touch panels are being developed as portable information terminals.

Light-emitting apparatuses including light-emitting devices have been developed as display apparatuses. Light-emitting devices (also referred to as EL devices or EL elements) utilizing electroluminescence (hereinafter referred to as EL) have features such as ease of reduction in thickness and weight, high-speed response to input signals, and driving with low DC voltage, and have been used in display apparatuses. For example, Patent Document 1 discloses a flexible light-emitting apparatus using an organic EL device (also referred to as organic EL element).

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a display apparatus having a photosensing function. An object of one embodiment of the present invention is to provide a highly convenient display apparatus. An object of one embodiment of the present invention is to provide a multifunctional display apparatus. An object of one embodiment of the present invention is to provide a display apparatus with high display quality. An object of one embodiment of the present invention is to provide a display apparatus with high light sensitivity. An object of one embodiment of the present invention is to simplify a circuit (also referred to as an external circuit) externally attached to a display apparatus. An object of one embodiment of the present invention is to provide a novel display apparatus.

Note that the description of these objects does not preclude the existence of other objects. One embodiment of the present invention does not need to achieve all these objects. Other objects can be derived from the descriptions of the specification, the drawings, and the claims.

Means for Solving the Problems

One embodiment of the present invention is a display apparatus including a first pixel circuit and a second pixel circuit; the first pixel circuit includes a light-receiving device, a first transistor, and a second transistor; the second pixel circuit includes a light-emitting device; the light-receiving device includes a first pixel electrode, an active layer, and a common electrode; the light-emitting device includes a second pixel electrode, a light-emitting layer, and the common electrode; the active layer is positioned over the first pixel electrode and includes a first organic compound; the light-emitting layer is positioned over the second pixel electrode and includes a second organic compound different from the first organic compound; the common electrode includes a portion overlapping with the first pixel electrode with the active layer therebetween and a portion overlapping with the second pixel electrode with the light-emitting layer therebetween; the first transistor includes low-temperature polysilicon as a semiconductor layer; and the second transistor includes a metal oxide as a semiconductor layer.

One embodiment of the present invention is a display apparatus including a first pixel circuit and a second pixel circuit; the first pixel circuit includes a light-receiving device, a first transistor, and a second transistor; the second pixel circuit includes a light-emitting device; the light-receiving device includes a first pixel electrode, a common layer, an active layer, and a common electrode; the light-emitting device includes a second pixel electrode, the common layer, a light-emitting layer, and the common electrode; the active layer is positioned over the first pixel electrode and includes a first organic compound; the light-emitting layer is positioned over the second pixel electrode and includes a second organic compound different from the first organic compound; the common electrode includes a portion overlapping with the first pixel electrode with the active layer therebetween and a portion overlapping with the second pixel electrode with the light-emitting layer therebetween; the common layer is positioned over the first pixel electrode and the second pixel electrode; the common layer includes a portion overlapping with the active layer and a portion overlapping with the light-emitting layer; the first transistor includes low-temperature polysilicon as a semiconductor layer; and the second transistor includes a metal oxide as a semiconductor layer.

The common layer preferably includes a layer serving as a hole-injection layer of the light-emitting device.

The common layer preferably includes a layer serving as a hole-transport layer of the light-emitting device.

The common layer preferably includes a layer serving as an electron-transport layer of the light-emitting device.

The common layer preferably includes a layer serving as an electron-injection layer of the light-emitting device.

The second pixel circuit further includes a third transistor using low-temperature polysilicon as a semiconductor layer. Alternatively, the second pixel circuit preferably includes a third transistor using a metal oxide as a semiconductor layer.

The display apparatus of one embodiment of the present invention preferably further includes a resin layer, a light-blocking layer, and a substrate. Each of the resin layer and the light-blocking layer is preferably positioned between the common electrode and the substrate.

The resin layer preferably has an opening overlapping with the light-receiving device. The resin layer preferably includes a portion overlapping with the light-emitting device. The light-blocking layer preferably includes a portion positioned between the common electrode and the resin layer. The light-blocking layer preferably covers at least part of the opening and at least part of a side surface of the resin layer exposed in the opening.

Alternatively, it is preferable that the resin layer have an island shape and include a portion overlapping with the light-emitting device. The light-blocking layer preferably include a portion positioned between the common electrode and the resin layer. At least part of light passing through the substrate preferably enters the light-receiving device without via the resin layer. The light-blocking layer preferably covers at least part of a side surface of the resin layer.

The display apparatus of one embodiment of the present invention preferably further includes an adhesive layer. The adhesive layer is preferably positioned between the common electrode and the substrate. Each of the resin layer and the light-blocking layer is preferably positioned between the adhesive layer and the substrate. The adhesive layer preferably includes a first portion overlapping with the light-receiving device and a second portion overlapping with the light-emitting device. The first portion is preferably thicker than the second portion.

The display apparatus of one embodiment of the present invention preferably has flexibility.

One embodiment of the present invention is a module that includes the display apparatus having any of the above structures. For example, the module is a module provided with a connector such as a FPC (flexible printed circuit) or a TCP (tape carrier package) or a module mounted with an integrated circuit (IC) by a COG (chip on glass) method, a COF (chip on film) method, or the like.

One embodiment of the present invention is an electronic device including the above module and at least one of an antenna, a battery, a housing, a camera, a speaker, a microphone, and an operation button.

Effect of the Invention

One embodiment of the present invention can provide a display apparatus having a photosensing function. One embodiment of the present invention can provide a highly convenient display apparatus. One embodiment of the present invention can provide a multifunctional display apparatus. One embodiment of the present invention can provide a display apparatus with high display quality. One embodiment of the present invention can provide a display apparatus having high light sensitivity. One embodiment of the present invention can simplify an external circuit for a display apparatus. One embodiment of the present invention can provide a novel display apparatus.

Note that the description of these effects does not preclude the existence of other effects. One embodiment of the present invention does not need to have all these effects. Other effects can be derived from the descriptions of the specification, the drawings, and the claims.

BRIEF DESCRIPTION OF THE DRAWINGS

FIG. 17A is a cross-sectional view illustrating an example of a display apparatus. FIG. 17B is a cross-sectional view illustrating an example of a transistor.

MODE FOR CARRYING OUT THE INVENTION

Figure 1A:
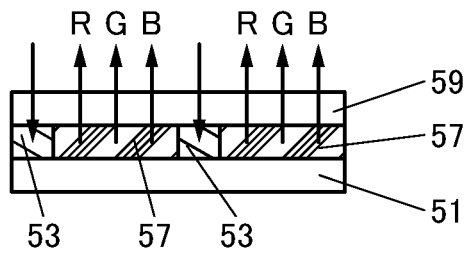
FIG. 1A to FIG. 1D are cross-sectional views illustrating examples of display apparatuses.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention.

Therefore, the present invention should not be construed as being limited to the description in the following embodiments.

Note that in structures of the present invention described below, the same portions or portions having similar functions are denoted by the same reference numerals in different drawings, and the description thereof is not repeated. The same hatching pattern is used for portions having similar functions, and the portions are not denoted by specific reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, a display apparatus of one embodiment of the present invention will be described with reference to FIG. 1 to FIG. 17.

In a display apparatus of this embodiment, a display portion includes light-receiving devices and light-emitting devices. In the display apparatus of this embodiment, the light-emitting devices are arranged in a matrix in the display portion, and an image can be displayed on the display portion. Moreover, the light-receiving devices are arranged in a matrix in the display portion, so that the display portion also functions as a light-receiving portion. The light-receiving portion can be used as an image sensor or a touch sensor. That is, by sensing light with the light-receiving portion, an image can be captured and the approach or contact of an object (e.g., a finger or a stylus) can be detected. Furthermore, in the display apparatus of this embodiment, the light-emitting devices can be used as a light source of the sensor. Accordingly, a light-receiving portion and a light source do not need to be provided separately from the display apparatus; hence, the number of components of an electronic device can be reduced.

In the display apparatus of this embodiment, when an object reflects light emitted from the light-emitting device included in the display portion, the light-receiving device can sense the reflected light; thus, image-capturing and touch (including near touch) detection are possible even in a dark place.

The display apparatus of this embodiment has a function of displaying an image using the light-emitting devices. That is, the light-emitting device functions as a display device.

As the light-emitting device, an EL device such as an OLED (Organic Light-Emitting Diode) and a QLED (Quantum-dot Light-Emitting Diode) is preferably used. Examples of a light-emitting substance included in the EL device include a substance exhibiting fluorescence (fluorescent material), a substance exhibiting phosphorescence (phosphorescent material), an inorganic compound (e.g., a quantum dot material), and a substance exhibiting thermally activated delayed fluorescence (Thermally Activated Delayed Fluorescent (TADF) material). Alternatively, an LED such as a micro-LED (Light Emitting Diode) can be used as the light-emitting device.

The display apparatus of this embodiment has a function of sensing light using the light-receiving device.

When the light-receiving device is used as an image sensor, the display apparatus of this embodiment can capture an image using the light-receiving device. For example, the display apparatus of this embodiment can be used as a scanner.

For example, data on a fingerprint, a palm print, an iris, or the like can be acquired with the image sensor. That is, a biological authentication sensor can be incorporated into the display apparatus of this embodiment. When the display apparatus incorporates a biological authentication sensor, the number of components of an electronic device can be reduced as compared to the case where a biological authentication sensor is provided separately from a display apparatus; thus, the size and weight of the electronic device can be reduced.

In addition, data on facial expression, eye movement, change of the pupil diameter, or the like of the user can be acquired with the image sensor. By analysis of the data, data on the user's physical and mental state can be acquired. Changing the output contents of one or both of display and sound on the basis of the data can allow the user to safely use a device for VR (Virtual Reality), AR (Augmented Reality), or MR (Mixed Reality), for example.

When the light-receiving device is used as the touch sensor, the display apparatus of this embodiment can detect the approach or contact of an object with the use of the light-receiving device.

As the light-receiving device, a PN photodiode or a PIN photodiode can be used, for example. The light-receiving device functions as a photoelectric conversion device that senses light entering the light-receiving device and generates electric charge. The amount of generated electric charge depends on the amount of incident light.

In particular, it is preferable to use an organic photodiode including a layer containing an organic compound as the light-receiving device. An organic photodiode, which is easily made thin, lightweight, and large in area and has a high degree of freedom for shape and design, can be used in a variety of display apparatuses.

In one embodiment of the present invention, an organic EL device is used as the light-emitting device, and an organic photodiode is used as the light-receiving device. The organic EL device and the organic photodiode can be formed over one substrate. Thus, the organic photodiode can be incorporated into the display apparatus using the organic EL device.

If all the layers of the organic EL device and the organic photodiode are formed separately, the number of film formation steps becomes extremely large. Since a large number of layers in the organic photodiode can have structures in common with the layers in the organic EL device, forming the layers having common structures collectively can prevent the increase in the number of film formation steps. Even when the number of film formation steps is the same, reducing the number of layers formed only in some devices can suppress the influence of deviation of a film formation pattern and the influence of dust (including small foreign substances called particles) attached to a deposition mask (e.g., a metal mask), for example. Thus, the yield of the manufacturing process of the display apparatus can be increased.

For example, one of a pair of electrodes (a common electrode) can be a layer shared by the light-receiving device and the light-emitting device. In another example, at least one of a hole-injection layer, a hole-transport layer, an electron-transport layer, and an electron-injection layer is preferably a layer shared by the light-receiving device and the light-emitting device. In another example, an active layer of the light-receiving device and a light-emitting layer of the light-emitting device are separately formed, and the other layers can have the same structure in the light-emitting device and the light-receiving device. When the light-receiving device and the light-emitting device include a common layer in such a manner, the number of film formation steps and the number of masks can be reduced, thereby reducing the number of manufacturing steps and the manufacturing cost of the display apparatus.

Note that a layer shared by the light-receiving device and the light-emitting device may have a different function between the light-receiving device and the light-emitting device. In this specification, the name of a component is based on its function in the light-emitting device. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device.

In the display apparatus of one embodiment of the present invention, it is preferable to use transistors including a metal oxide (also referred to as an oxide semiconductor) in their semiconductor layers where channels are formed (such transistors are also referred to as OS transistors hereinafter) as all the transistors included in the pixel circuit including a light-receiving devices and the pixel circuit including a light-emitting device. Such an OS transistor has an extremely low off-state current and enables electric charge stored in a capacitor that is series-connected to the transistor to be retained for a long time. Furthermore, power consumption of the display apparatus can be reduced with the OS transistor.

Alternatively, in the display apparatus of one embodiment of the present invention, it is preferable to use transistors including silicon in their semiconductor layers where channels are formed (such transistors are also referred to as Si transistors below) as all the transistors included in the pixel circuit including a light-receiving device and the pixel circuit including a light-emitting device. As silicon, single crystal silicon, polycrystalline silicon, amorphous silicon, and the like can be given. In particular, it is preferable to use transistors including low-temperature polysilicon (LTPS) (hereinafter also referred to as LTPS transistors) in their semiconductor layers. An LTPS transistor has high field-effect mobility and can operate at high speed.

With the use of Si transistors such as LTPS transistors, a variety of circuits formed using a CMOS circuit and a display portion can be easily formed on the same substrate. Thus, external circuits mounted on the display apparatus can be simplified, and costs of parts and mounting costs can be reduced.

Alternatively, in the display apparatus of one embodiment of the present invention, two kinds of transistors are preferably used in the pixel circuit including a light-receiving device. Specifically, the pixel circuit preferably includes an OS transistor and an LTPS transistor. Changing the material of the semiconductor layer depending on the desired function of the transistor can increase the quality of the pixel circuit including a light-receiving device and the accuracy of sensing and imaging. In that case, in the pixel circuit including light-emitting device, one or both of an OS transistor and an LTPS transistor may be used.

Furthermore, even when two kinds of transistors are used, using the LTPS transistors facilitates formation of a variety of circuits formed using a CMOS circuit and a display portion on the same substrate. Thus, external circuits mounted on the display apparatus can be simplified, and costs of parts and mounting costs can be reduced.

In the display apparatus of one embodiment of the present invention, light emitted from the light-emitting device is extracted through a display surface, and the light passes through the display surface to enter the light-receiving device. In the display apparatus, a light-blocking layer is preferably provided on the side of the display surface rather than the light-emitting device and the light-receiving device. Light emitted from the light-emitting device is preferably extracted to the outside of the display apparatus through an opening in the light-blocking layer (or a region where the light-blocking layer is not provided). The light-receiving device is preferably irradiated with light passing through an opening in the light-blocking layer (or a region where the light-blocking layer is not provided).

The light-receiving device senses light that is emitted from the light-emitting device and then reflected by an object. However, in some cases, light emitted from the light-emitting device is reflected inside the display apparatus and enters the light-receiving device without via an object. Such stray light ends up as noise in light detection, which is a factor reducing an S/N ratio (signal-to-noise ratio). Providing the light-blocking layer on the display surface side rather than the side of the light-emitting device and the light-receiving device can reduce the influence of stray light. Thus, noise can be reduced, and the sensitivity of the sensor using the light-receiving device can be increased.

As the light-blocking layer is positioned closer to the light-emitting device, stray light from the light-emitting device inside the display apparatus can be reduced and the sensitivity of the sensor can be increased. Furthermore, as the light-blocking layer is positioned closer to the light-emitting device, the amount of contrast reduction and chromaticity change at the time when the display apparatus is seen from the oblique direction can be reduced, and viewing angle characteristics of display can be better. On the other hand, as the light-blocking layer is positioned further from the light-emitting device, the area of the imaging range of the light-receiving device can be smaller, and the imaging resolution can be higher.

Thus, in one embodiment of the present invention, a component (e.g., a resin layer) is provided on a surface where the light-blocking layer is formed, to cause a difference between the distance from the light-blocking layer to the light-receiving device and the distance from the light-blocking layer to the light-emitting device. Adjusting the layout and thickness of the component can increase the distance from the light-blocking layer to the light-receiving device and reduce the distance from the light-blocking layer to the light-emitting device. Accordingly, noise of the sensor can be reduced, the imaging resolution can be increased, and viewing angle dependence of display can be reduced. Thus, both the display quality and imaging quality of the display apparatus can be increased.

Specifically, it is preferred that the display apparatus of one embodiment of the present invention further include a resin layer, a light-blocking layer, and a substrate. The resin layer and the light-blocking layer are each preferably positioned between the common electrode and the substrate.

At least part of light emitted from the light-emitting device is extracted to the outside of the substrate through the resin layer. At least part of light passing through the substrate enters the light-receiving device without via the resin layer. For example, the resin layer has an opening overlapping with the light-receiving device. Alternatively, the resin layer is provided to have an island shape in a region overlapping with the light-emitting device.

The resin layer is provided at the position overlapping with the light-emitting device and is not provided at the position overlapping with the light-receiving device. Thus, the distance from the light-blocking layer to the light-emitting device is shorter than the distance from the light-blocking layer to the light-receiving device. Consequently, both the display quality and imaging quality of the display apparatus can be increased.

FIG. 1A to FIG. 1D are cross-sectional views of display apparatuses of one embodiment of the present invention.

A display apparatus 50A illustrated in FIG. 1A includes a layer 53 including light-receiving devices and a layer 57 including light-emitting devices, between a substrate 51 and a substrate 59.

Figure 1B:
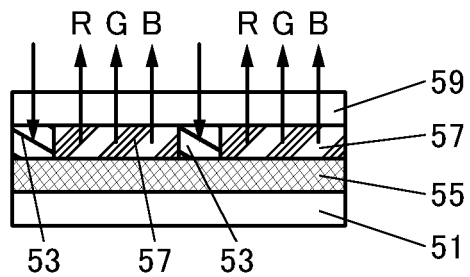

A display apparatus 50B illustrated in FIG. 1B includes the layer 53 including light-receiving devices, a layer 55 including transistors, and the layer 57 including light-emitting devices, between the substrate 51 and the substrate 59.

In the display apparatus 50A and the display apparatus 50B, red (R) light, green (G) light, and blue (B) light are emitted from the layer 57 including light-emitting devices.

The display apparatus of one embodiment of the present invention includes a plurality of pixels arranged in a matrix. One pixel includes one or more subpixels. One subpixel includes one light-emitting device. For example, a pixel can include three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel also includes a light-receiving device. The light-receiving device may be provided in all the pixels or in some of the pixels. In addition, one pixel may include a plurality of light-receiving devices.

The layer 55 including transistors preferably includes a first transistor and a second transistor. The first transistor is electrically connected to the light-receiving device. The second transistor is electrically connected to the light-emitting device.

Figure 1C:
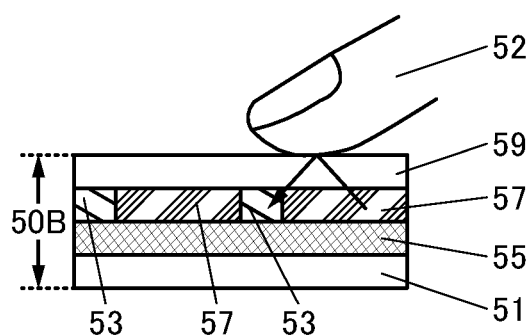

The display apparatus of one embodiment of the present invention may have a function of sensing an object such as a finger that is touching the display apparatus. For example, after light emitted from the light-emitting device in the layer 57 including light-emitting devices is reflected by a finger 52 that touches the display apparatus 50B as illustrated in FIG. 1C, the light-receiving device in the layer 53 including light-receiving devices senses the reflected light. Thus, the touch of the finger 52 on the display apparatus 50B can be detected.

Figure 1D:
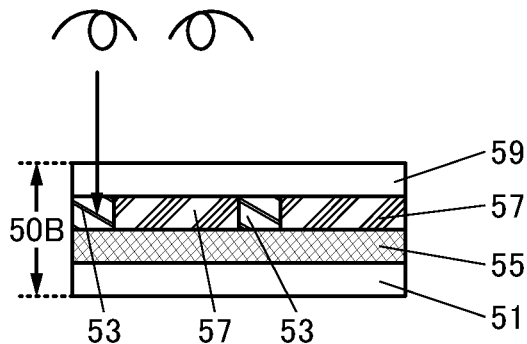

The display apparatus of one embodiment of the present invention may have a function of sensing or imaging of an object that is approaching (but is not touching) the display apparatus 50B as illustrated in FIG. 1D.

[Pixel]

FIG. 1E to FIG. 1I illustrate examples of pixels.

Figure 1E:
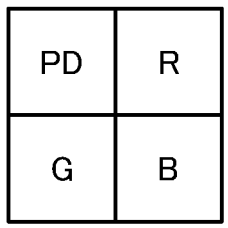
FIG. 1E to FIG. 1I are top views illustrating examples of pixels.
Figure 1F:
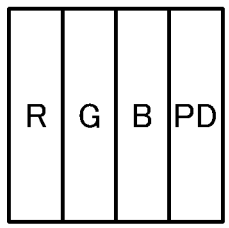
Figure 1G:
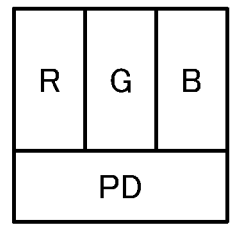

The pixel illustrated in each of FIG. 1E to FIG. 1G includes three subpixels (three light-emitting devices) of R, G, and B and a light-receiving device PD. FIG. 1E illustrates an example in which the three subpixels and the light-receiving device PD are arranged in a 2×2 matrix. FIG. 1F illustrates an example in which the three subpixels and the light-receiving device PD are arranged horizontally in a line. FIG. 1G illustrates an example in which the three subpixels are arranged horizontally in a line and the light-receiving device PD is placed beneath the subpixels. Note that each of the pixels in FIG. 1E to FIG. 1G can be said to consist of four subpixels, that is, three subpixels are used to perform display and one subpixel is used to sense light.

Figure 1H:
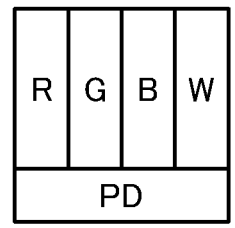

The pixel illustrated in FIG. 1H includes four subpixels (four light-emitting devices) of R, G, B, and W and the light-receiving device PD.

Figure 1I:
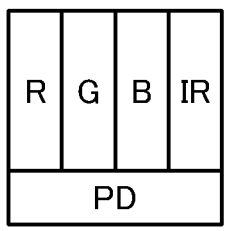

The pixel illustrated in FIG. 1I includes three subpixels of R, G, and B, a light-emitting device IR that emits infrared light, and the light-receiving device PD. Here, the light-receiving device PD preferably has a function of sensing infrared light. The light-receiving device PD may have a function of sensing both visible light and infrared light. The wavelength of light that the light-receiving device PD senses can be determined depending on the application of the sensor.

The detailed structures of the light-emitting device and the light-receiving device included in the display apparatus of one embodiment of the present invention will be described below with reference to FIG. 2 to FIG. 12.

The display apparatus of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

FIG. 2 to FIG. 12 illustrate top-emission display apparatuses as examples.

Although this embodiment mainly describes a display apparatus including a light-emitting device that emits visible light and a light-receiving device that senses visible light, the display apparatus may also include a light-emitting device that emits infrared light. The light-receiving device may be configured to sense infrared light or sense both visible light and infrared light.

[Display Apparatus 10]

Figure 2:
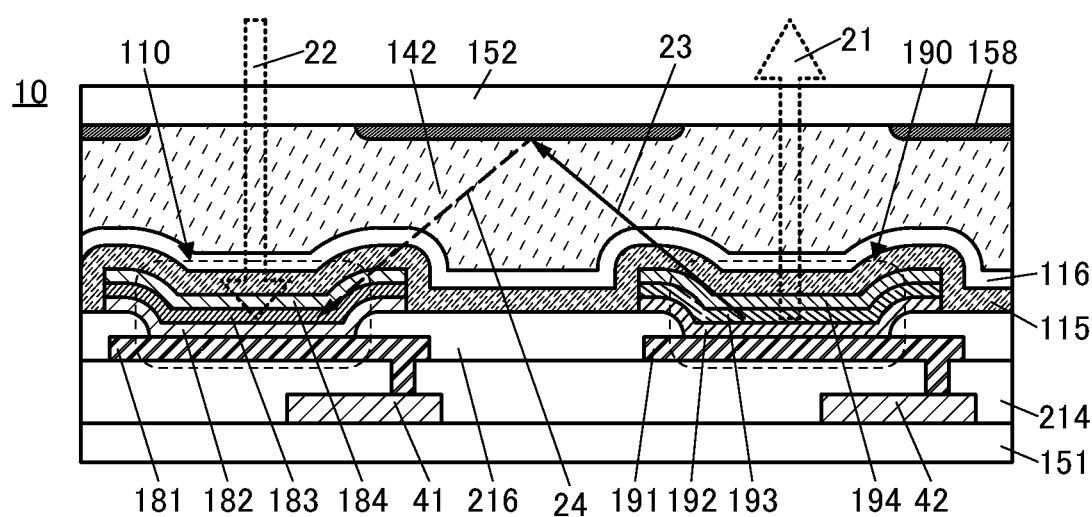
FIG. 2 is a cross-sectional view illustrating an example of a display apparatus.

FIG. 2 is a cross-sectional view of a display apparatus 10.

The display apparatus 10 includes a light-receiving device 110 and a light-emitting device 190.

The light-emitting device 190 includes a pixel electrode 191, a buffer layer 192, a light-emitting layer 193, a buffer layer 194, and a common electrode 115. The light-emitting layer 193 contains an organic compound. The light-emitting device 190 has a function of emitting visible light. Note that the display apparatus 10 may also include a light-emitting device having a function of emitting infrared light. In this embodiment, the case where the pixel electrode 191 functions as an anode and the common electrode 115 functions as a cathode is described as an example.

The light-receiving device 110 includes a pixel electrode 181, a buffer layer 182, an active layer 183, a buffer layer 184, and the common electrode 115. The active layer 183 contains an organic compound. The light-receiving device 110 has a function of sensing visible light. Note that the light-receiving device 110 may also have a function of sensing infrared light. In this embodiment, a case is described where the pixel electrode 181 functions as an anode and the common electrode 115 functions as a cathode as in the light-emitting device 190. In other words, the light-receiving device 110 is driven by application of reverse bias between the pixel electrode 181 and the common electrode 115, whereby the display apparatus 10 can sense light incident on the light-receiving device 110, generate electric charge, and extract it as current.

The pixel electrode 181, the pixel electrode 191, the buffer layer 182, the buffer layer 192, the active layer 183, the light-emitting layer 193, the buffer layer 184, the buffer layer 194, and the common electrode 115 may each have a single-layer structure or a stacked-layer structure.

The pixel electrode 181 and the pixel electrode 191 are positioned over an insulating layer 214. The pixel electrode 181 and the pixel electrode 191 can be formed using the same material in the same step. An end portion of the pixel electrode 181 and an end portion of the pixel electrode 191 are each covered with a partition 216. The pixel electrode 181 and the pixel electrode 191 are electrically isolated (electrically separated) from each other by the partition 216.

An organic insulating film is suitable for the partition 216. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The partition 216 is a layer that transmits visible light. Although the details will be described later, a partition 217 that blocks visible light may be provided in place of the partition 216.

The buffer layer 182 is positioned over the pixel electrode 181. The active layer 183 overlaps with the pixel electrode 181 with the buffer layer 182 therebetween. The buffer layer 184 is positioned over the active layer 183. The active layer 183 overlaps with the common electrode 115 with the buffer layer 184 therebetween. The buffer layer 182 can include a hole-transport layer. The buffer layer 184 can include an electron-transport layer.

The buffer layer 192 is positioned over the pixel electrode 191. The light-emitting layer 193 overlaps with the pixel electrode 191 with the buffer layer 192 therebetween. The buffer layer 194 is positioned over the light-emitting layer 193. The light-emitting layer 193 overlaps with the common electrode 115 with the buffer layer 194 therebetween. The buffer layer 192 can include one or both of a hole-injection layer and a hole-transport layer. The buffer layer 194 can include one or both of an electron-injection layer and an electron-transport layer.

The common electrode 115 is a layer shared by the light-receiving device 110 and the light-emitting device 190.

The material, thickness, and the like of the pair of electrodes can be the same between the light-receiving device 110 and the light-emitting device 190. Thus, the manufacturing cost of the display apparatus can be reduced, and the manufacturing process of the display apparatus can be simplified.

The display apparatus 10 includes the light-receiving device 110, the light-emitting device 190, a transistor 41, a transistor 42, and the like between a pair of substrates (a substrate 151 and a substrate 152).

In the light-receiving device 110, the buffer layer 182, the active layer 183, and the buffer layer 184, which are positioned between the pixel electrode 181 and the common electrode 115, can each be expressed as an organic layer (a layer containing an organic compound). The pixel electrode 181 preferably has a function of reflecting visible light. The common electrode 115 has a function of transmitting visible light. Note that in the case where the light-receiving device 110 is configured to sense infrared light, the common electrode 115 has a function of transmitting infrared light. Furthermore, the pixel electrode 181 preferably has a function of reflecting infrared light.

The light-receiving device 110 has a function of sensing light. Specifically, the light-receiving device 110 is a photoelectric conversion device that receives light 22 incident from the outside of the display apparatus 10 and converts the light 22 into an electric signal. The light 22 can also be expressed as light that is emitted from the light-emitting device 190 and then reflected by an object. The light 22 may enter the light-receiving device 110 through a lens described later.

In the light-emitting device 190, each of the buffer layer 192, the light-emitting layer 193, and the buffer layer 194, which are positioned between the pixel electrode 191 and the common electrode 115, can be also referred to as an EL layer. The pixel electrode 191 preferably has a function of reflecting visible light. The common electrode 115 has a function of transmitting visible light. Note that when the display apparatus 10 includes a light-emitting device that emits infrared light, the common electrode 115 has a function of transmitting infrared light. Furthermore, the pixel electrode 191 preferably has a function of reflecting infrared light.

The light-emitting device included in the display apparatus of this embodiment preferably employs a microcavity structure. Therefore, one of the pair of electrodes of the light-emitting device is preferably an electrode having properties of transmitting and reflecting visible light (transflective electrode), and the other is preferably an electrode having a property of reflecting visible light (reflective electrode). When the light-emitting device has a microcavity structure, light obtained from the light-emitting layer can be resonated between the electrodes, whereby light emitted from the light-emitting device can be intensified.

Note that the transflective electrode can have a stacked-layer structure of a reflective electrode and an electrode having a property of transmitting visible light (also referred to as a transparent electrode). In this specification and the like, the reflective electrode functioning as part of a transflective electrode may be referred to as a pixel electrode or a common electrode, and the transparent electrode may be referred to as an optical adjustment layer; however, in some cases, the transparent electrode (optical adjustment layer) can also be regarded as having a function of a pixel electrode or a common electrode.

The transparent electrode has a light transmittance of higher than or equal to 40%. For example, the light-emitting device preferably includes an electrode having a visible light (light at wavelengths greater than or equal to 400 nm and less than 750 nm) transmittance of higher than or equal to 40%. The visible light reflectivity of the transflective electrode is higher than or equal to 10% and lower than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ Ωcm or lower. Note that in the case where a light-emitting device that emits near-infrared light is used in the display apparatus, the near-infrared light (light at wavelengths greater than or equal to 750 nm to less than or equal to 1300 nm) transmittance and reflectivity of these electrodes are preferably in the above ranges.

The buffer layer 192 or the buffer layer 194 may have a function of an optical adjustment layer. By changing the thickness of the buffer layer 192 or the buffer layer 194, light of a specific color can be intensified and taken out from each light-emitting device. Note that when the transflective electrode has a stacked-layer structure of a reflective electrode and a transparent electrode, the optical path length between the pair of electrodes represents the optical path length between a pair of reflective electrodes.

The light-emitting device 190 has a function of emitting visible light. Specifically, the light-emitting device 190 is an electroluminescent device that emits light toward the substrate 152 (see emitted light 21) when voltage is applied between the pixel electrode 191 and the common electrode 115.

It is preferable that the light-emitting layer 193 be formed not to overlap with the light-receiving device 110. Accordingly, it is possible to prevent the light-emitting layer 193 from absorbing the light 22, thereby increasing the amount of light with which the light-receiving device 110 is irradiated.

The pixel electrode 181 is electrically connected to a source or a drain of the transistor 41 through an opening provided in the insulating layer 214.

The pixel electrode 191 is electrically connected to a source or a drain of the transistor 42 through an opening provided in the insulating layer 214. The transistor 42 has a function of controlling the driving of the light-emitting device 190.

The transistor 41 and the transistor 42 are on and in contact with the same layer (the substrate 151 in FIG. 2).

At least part of a circuit electrically connected to the light-receiving device 110 is preferably formed using the same material in the same steps as a circuit electrically connected to the light-emitting device 190. Thus, the thickness of the display apparatus can be reduced and the manufacturing process can be simplified, compared to the case where the two circuits are separately formed.

The light-receiving device 110 and the light-emitting device 190 are preferably covered with a protective layer 116. In FIG. 2, the protective layer 116 is provided on and in contact with the common electrode 115. Providing the protective layer 116 can inhibit entry of impurities such as water into the light-receiving device 110 and the light-emitting device 190, thereby increasing the reliability of the light-receiving device 110 and the light-emitting device 190. The protective layer 116 and the substrate 152 are attached to each other with an adhesive layer 142.

A light-blocking layer 158 is provided on a surface of the substrate 152 on the substrate 151 side. The light-blocking layer 158 has an opening at the position overlapping with the light-emitting device 190 and an opening at the position overlapping with the light-receiving device 110. Note that in this specification and the like, the position overlapping with the light-emitting device 190 refers specifically to a position overlapping with a light-emitting region of the light-emitting device 190. Similarly, the position overlapping with the light-receiving device 110 refers specifically to a position overlapping with a light-receiving region of the light-receiving device 110.

Here, the light-receiving device 110 senses light that is emitted from the light-emitting device 190 and then reflected by an object. However, in some cases, light emitted from the light-emitting device 190 is reflected inside the display apparatus 10 and enters the light-receiving device 110 without via an object. The light-blocking layer 158 can reduce the influence of such stray light. For example, in the case where the light-blocking layer 158 is not provided, light 23 emitted from the light-emitting device 190 is reflected by the substrate 152 and reflected light 24 enters the light-receiving device 110 in some cases. Providing the light-blocking layer 158 can inhibit entry of the reflected light 24 into the light-receiving device 110. Thus, noise can be reduced, and the sensitivity of the sensor using the light-receiving device 110 can be increased.

For the light-blocking layer 158, a material that blocks light from the light-emitting device can be used. The light-blocking layer 158 preferably absorbs visible light. As the light-blocking layer 158, a black matrix can be formed using a metal material or a resin material containing pigment (e.g., carbon black) or dye, for example. The light-blocking layer 158 may have a stacked-layer structure of a red color filter, a green color filter, and a blue color filter.

[Display Apparatus 10A]

Figure 3A:
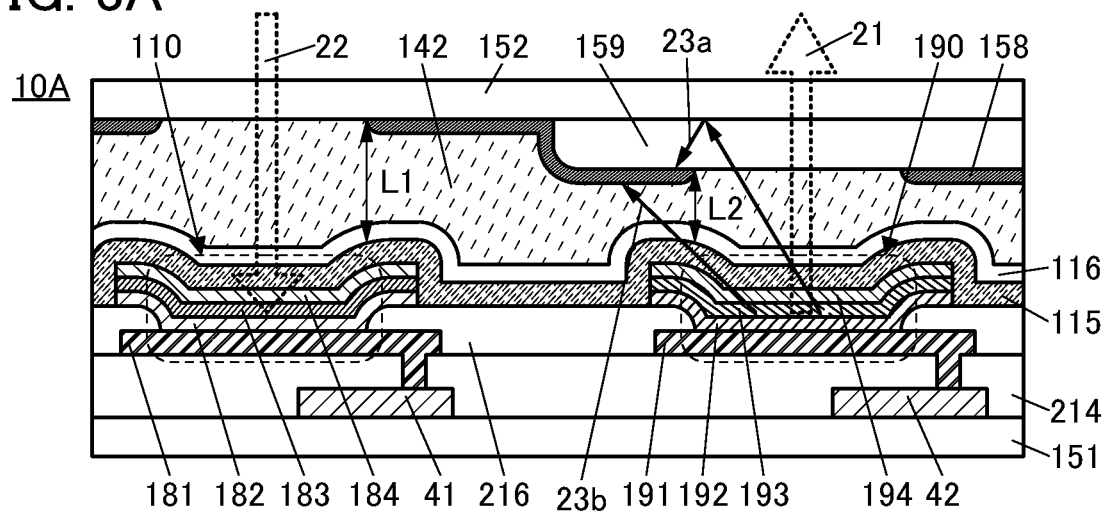
FIG. 3A is a cross-sectional view illustrating an example of a display apparatus.

FIG. 3A is a cross-sectional view of a display apparatus 10A. Note that in the following description of display apparatuses, the description of components similar to those of the above-described display apparatus may be omitted.

The display apparatus 10A is different from the display apparatus 10 in including a resin layer 159.

The resin layer 159 is provided on a surface of the substrate 152 on the substrate 151 side. The resin layer 159 is provided at the position overlapping with the light-emitting device 190 and is not provided at the position overlapping with the light-receiving device 110.

Figure 3B:
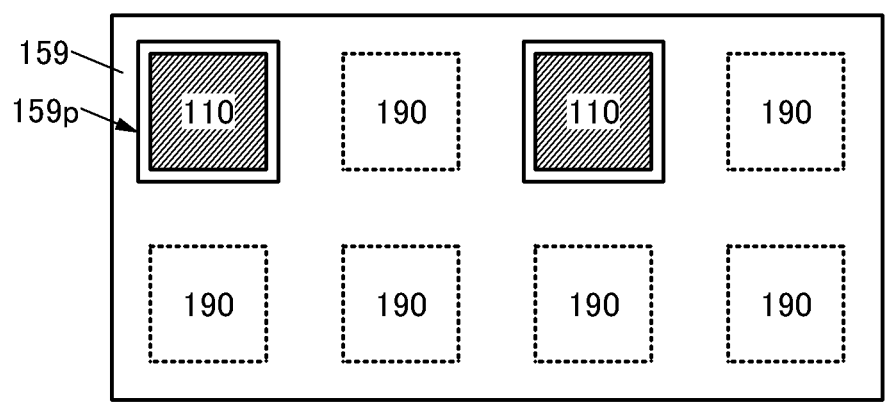
FIG. 3B and FIG. 3C are diagrams each illustrating an example of a top layout of a resin layer.
Figure 3C:
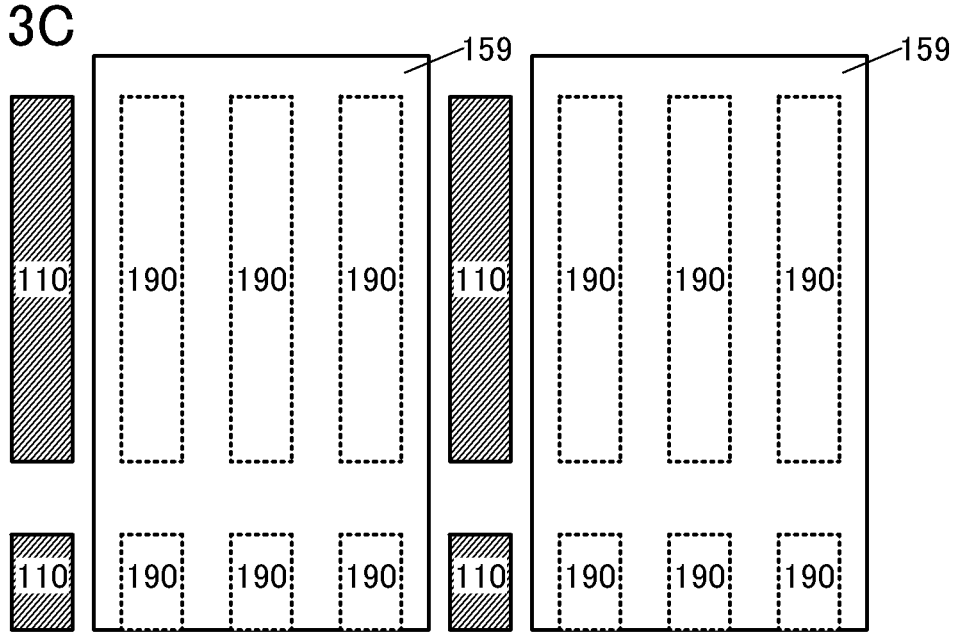

The resin layer 159 can be provided at the position overlapping with the light-emitting device 190 and have an opening 159p at the position overlapping with the light-receiving device 110, as illustrated in FIG. 3B, for example. As another example, as illustrated in FIG. 3C, the resin layer 159 can be provided to have an island shape at the position overlapping with the light-emitting device 190 but not at the position overlapping with the light-receiving device 110.

The light-blocking layer 158 is provided on surfaces of the substrate 152 and the resin layer 159 on the substrate 151 side. The light-blocking layer 158 has an opening at the position overlapping with the light-emitting device 190 and an opening at the position overlapping with the light-receiving device 110.

For example, the light-blocking layer 158 can absorb stray light 23a that has passed through the resin layer 159 and has been reflected by the surface of the substrate 152 on the substrate 151 side. Moreover, the light-blocking layer 158 can absorb stray light 23b before the stray light 23b reaches the resin layer 159. Thus, stray light incident on the light-receiving device 110 can be reduced. Consequently, noise can be reduced, and the sensitivity of the sensor using the light-receiving device 110 can be increased. It is particularly preferable that the light-blocking layer 158 be positioned close to the light-emitting device 190, in which case stray light can be further reduced. This is preferable also in terms of display quality, because the light-blocking layer 158 provided close to the light-emitting device 190 can reduce viewing angle dependence of display.

Providing the light-blocking layer 158 can control the range where the light-receiving device 110 senses light. When the light-blocking layer 158 is positioned apart from the light-receiving device 110, the imaging range is narrowed, and the imaging resolution can be increased.

In the case where the resin layer 159 has an opening, the light-blocking layer 158 preferably covers at least part of the opening and at least part of a side surface of the resin layer 159 exposed in the opening.

In the case where the resin layer 159 is provided in an island shape, the light-blocking layer 158 preferably covers at least part of a side surface of the resin layer 159.

Since the light-blocking layer 158 is provided along the shape of the resin layer 159 in such a manner, the distance from the light-blocking layer 158 to the light-emitting device 190 (specifically, the light-emitting region of the light-emitting device 190) is shorter than the distance from the light-blocking layer 158 to the light-receiving device 110 (specifically, the light-receiving region of the light-receiving device 110). Accordingly, noise of the sensor can be reduced, the imaging resolution can be increased, and viewing angle dependence of display can be reduced. Thus, both the display quality and imaging quality of the display apparatus can be increased.

The resin layer 159 transmits light emitted from the light-emitting device 190. Examples of materials for the resin layer 159 include an acrylic resin, a polyimide resin, an epoxy resin, a polyamide resin, a polyimide-amide resin, a siloxane resin, a benzocyclobutene-based resin, a phenol resin, and precursors of these resins. Note that a component provided between the substrate 152 and the light-blocking layer 158 is not limited to the resin layer and may be an inorganic insulating film or the like. As the component becomes thicker, a larger difference occurs between the distance from the light-blocking layer to the light-receiving device and the distance from the light-blocking layer to the light-emitting device. An organic insulating film made of a resin or the like is suitable for the component because it is easily formed to have a large thickness.

In order to compare the distance from the light-blocking layer 158 to the light-receiving device 110 and the distance from the light-blocking layer 158 to the light-emitting device 190, it is possible to use, for example, the shortest distance L1 from an end portion of the light-blocking layer 158 on the light-receiving device 110 side to the common electrode 115 and the shortest distance L2 from an end portion of the light-blocking layer 158 on the light-emitting device 190 side to the common electrode 115. With the shortest distance L2 smaller than the shortest distance L1, stray light from the light-emitting device 190 can be suppressed, and the sensitivity of the sensor using the light-receiving device 110 can be increased. Furthermore, viewing angle dependence of display can be reduced. With the shortest distance L1 larger than the shortest distance L2, the imaging range of the light-receiving device 110 can be narrowed, and the imaging resolution can be increased.

In addition, when the adhesive layer 142 is provided such that a portion overlapping with the light-receiving device 110 is made thicker than a portion overlapping with the light-emitting device 190, a difference can be made between the distance from the light-blocking layer 158 to the light-receiving device 110 and the distance from the light-blocking layer 158 to the light-emitting device 190.

[Display Apparatus 10B]

Figure 4A:
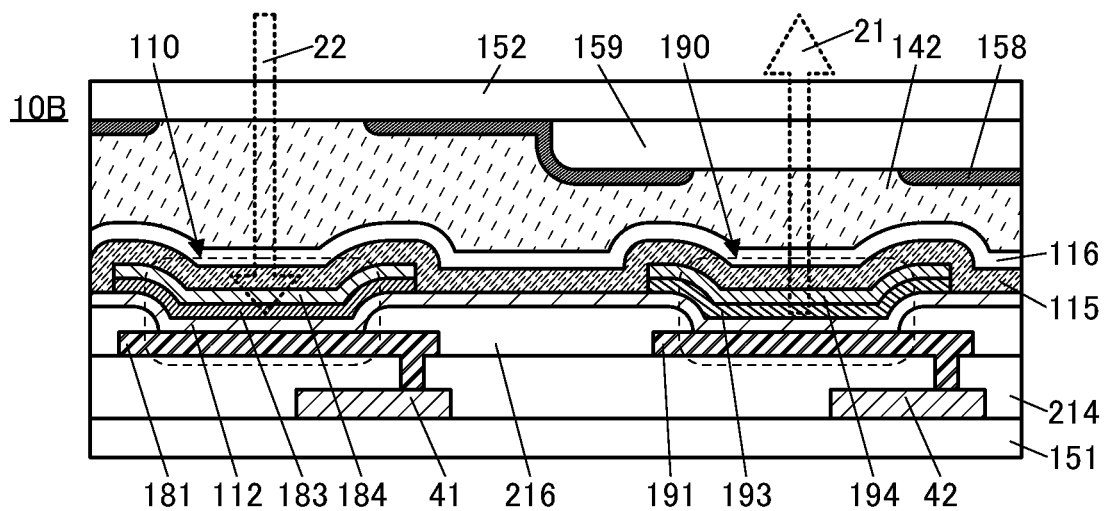
FIG. 4A and FIG. 4B are cross-sectional views each illustrating an example of a display apparatus.

FIG. 4A is a cross-sectional view of a display apparatus 10B.

The display apparatus 10B is different from the display apparatus 10A in that the display apparatus 10B includes neither the buffer layer 182 nor the buffer layer 192 but includes a common layer 112.

The common layer 112 is positioned over the partition 216, the pixel electrode 181, and the pixel electrode 191. The common layer 112 is shared by the light-receiving device 110 and the light-emitting device 190. The common layer 112 may have a single-layer structure or a stacked-layer structure.

As the common layer 112, one or both of a hole-injection layer and a hole-transport layer can be formed, for example. A function of the common layer 112 in the light-emitting device 190 may be different from its function in the light-receiving device 110. For example, when the common layer 112 includes a hole-injection layer, the hole-injection layer functions as a hole-injection layer in the light-emitting device 190 and functions as a hole-transport layer in the light-receiving device 110.

It is preferred that at least one of the layers other than the active layer and the light-emitting layer be shared by the light-receiving device and the light-emitting device, in which case the number of steps of manufacturing the display apparatus can be reduced.

[Display Apparatus 10C]

Figure 4B:
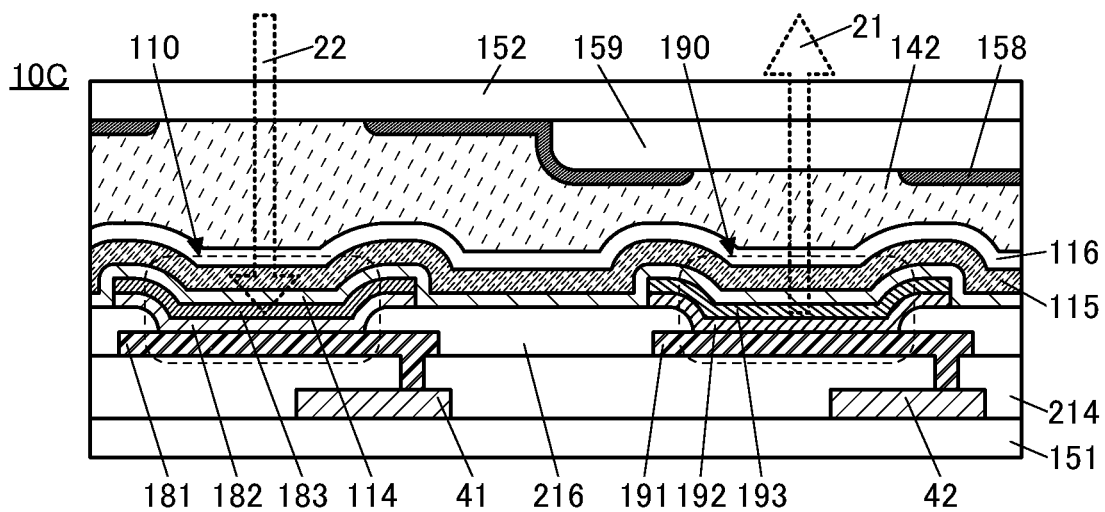

FIG. 4B is a cross-sectional view of a display apparatus 10C.

The display apparatus 10C is different from the display apparatus 10A in that the display apparatus 10C includes neither the buffer layer 184 nor the buffer layer 194 but includes a common layer 114.

The common layer 114 is positioned over the partition 216, the active layer 183, and the light-emitting layer 193. The common layer 114 is shared by the light-receiving device 110 and the light-emitting device 190. The common layer 114 may have a single-layer structure or a stacked-layer structure.

As the common layer 114, one or both of an electron-injection layer and an electron-transport layer can be formed, for example. A function of the common layer 114 in the light-emitting device 190 may be different from its function in the light-receiving device 110. For example, when the common layer 114 includes an electron-injection layer, the electron-injection layer functions as an electron-injection layer in the light-emitting device 190 and functions as an electron-transport layer in the light-receiving device 110.

It is preferred that at least one of the layers other than the active layer and the light-emitting layer be shared by the light-receiving device and the light-emitting device, in which case the number of steps of manufacturing the display apparatus can be reduced.

[Display Apparatus 10D]

Figure 5A:
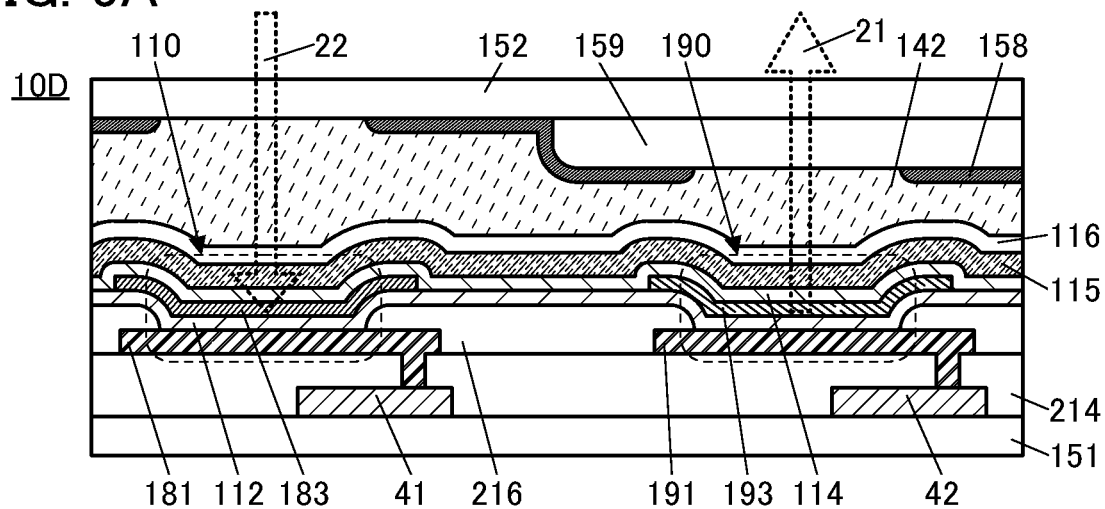
FIG. 5A to FIG. 5C are cross-sectional views each illustrating an example of a display apparatus.

FIG. 5A is a cross-sectional view of a display apparatus 10D.

The display apparatus 10D is different from the display apparatus 10A in that the display apparatus 10D does not include the buffer layer 182, the buffer layer 192, the buffer layer 184, and the buffer layer 194 and includes the common layer 112 and the common layer 114.

In the display apparatus of this embodiment, an organic compound is used for the active layer 183 of the light-receiving device 110. In the light-receiving device 110, the layers other than the active layer 183 can have structures in common with the layers in the light-emitting device 190 (EL device). Therefore, the light-receiving device 110 can be formed concurrently with the formation of the light-emitting device 190 only by adding a step of forming the active layer 183 in the manufacturing process of the light-emitting device 190. The light-emitting device 190 and the light-receiving device 110 can be formed over one substrate. Accordingly, the light-receiving device 110 can be incorporated into the display apparatus without a significant increase in the number of manufacturing steps.

The display apparatus 10D illustrates an example in which the light-receiving device 110 and the light-emitting device 190 have a common structure except that the active layer 183 of the light-receiving device 110 and the light-emitting layer 193 of the light-emitting device 190 are separately formed. Note that the structures of the light-receiving device 110 and the light-emitting device 190 are not limited thereto. The light-receiving device 110 and the light-emitting device 190 may include a separately formed layer other than the active layer 183 and the light-emitting layer 193 (see the above-described display apparatuses 10A, 10B, and 10C). The light-receiving device 110 and the light-emitting device 190 preferably include at least one layer used in common (common layer). Thus, the light-receiving device 110 can be incorporated into the display apparatus without a significant increase in the number of manufacturing steps.

[Display Apparatus 10E]

Figure 5B:
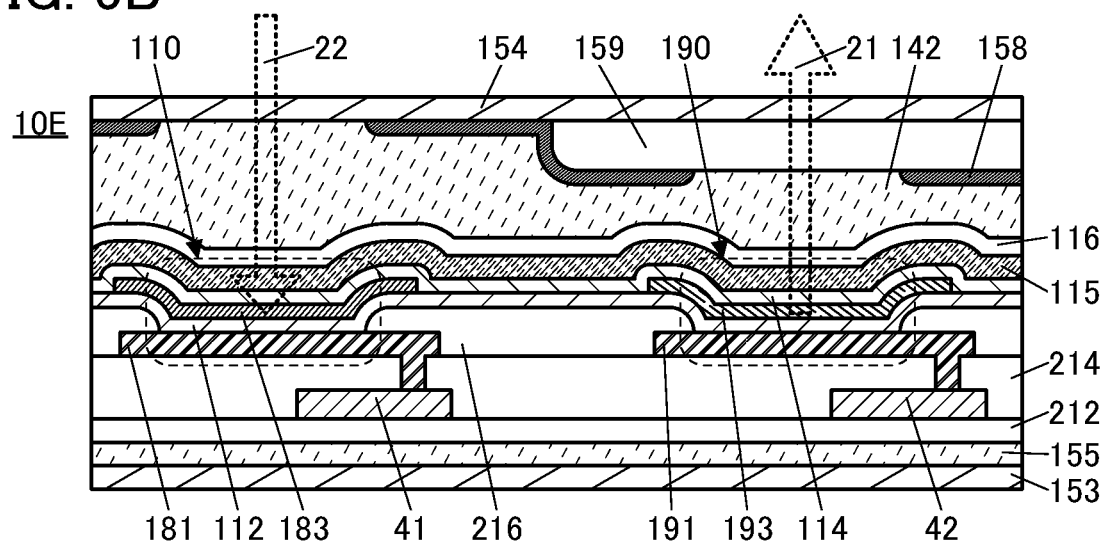

FIG. 5B is a cross-sectional view of a display apparatus 10E.

The display apparatus 10E differs from the display apparatus 10D in that the display apparatus 10E includes neither the substrate 151 nor the substrate 152 and includes a substrate 153, a substrate 154, an adhesive layer 155, and an insulating layer 212.

The substrate 153 and the insulating layer 212 are attached to each other with the adhesive layer 155. The substrate 154 and the protective layer 116 are attached to each other with the adhesive layer 142.

The display apparatus 10E is formed in such a manner that the insulating layer 212, the transistor 41, the transistor 42, the light-receiving device 110, the light-emitting device 190, and the like that are formed over a formation substrate are transferred onto the substrate 153. The substrate 153 and the substrate 154 are preferably flexible. Accordingly, the flexibility of the display apparatus 10E can be increased. For example, a resin is preferably used for the substrate 153 and the substrate 154.

For the substrate 153 and the substrate 154, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrates 153 and 154.

As the substrate included in the display apparatus of this embodiment, a film having high optical isotropy may be used. Examples of the film having high optical isotropy include a triacetyl cellulose (TAC, also referred to as cellulose triacetate) film, a cycloolefin polymer (COP) film, a cycloolefin copolymer (COC) film, and an acrylic film.

[Display Apparatuses 10F, 10G, and 10H]

Figure 5C:
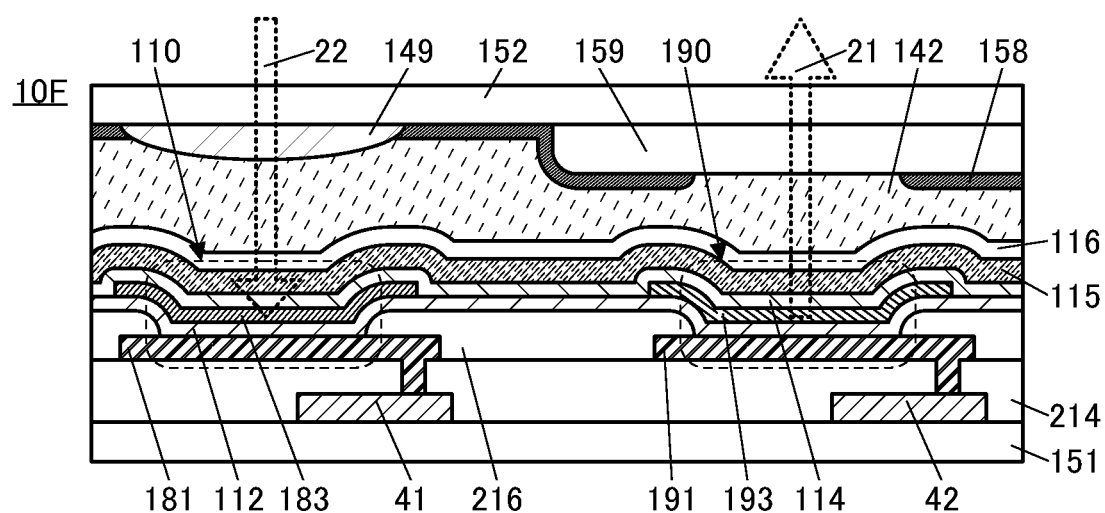
Figure 6A:
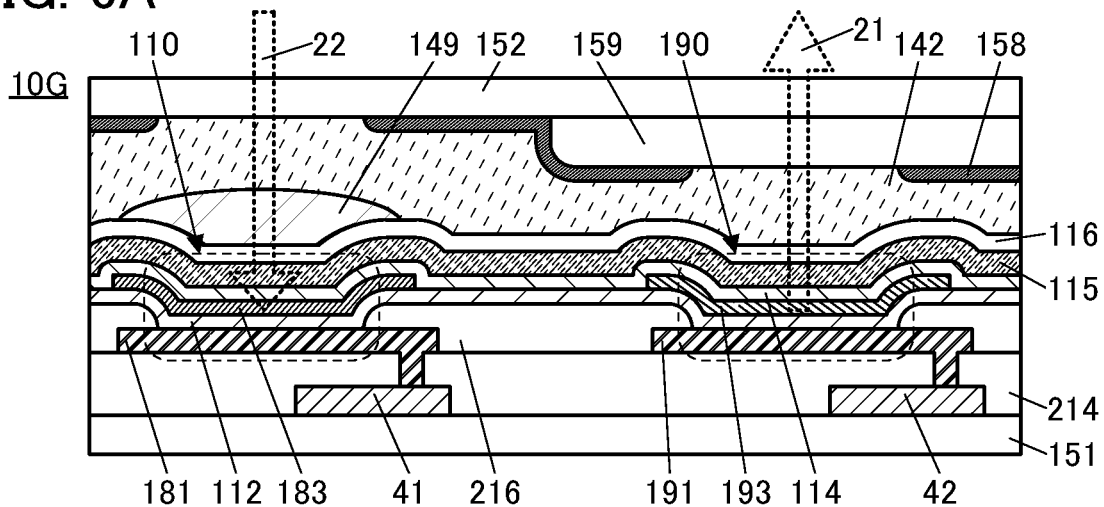
FIG. 6A to FIG. 6C are cross-sectional views each illustrating an example of a display apparatus.
Figure 6B:
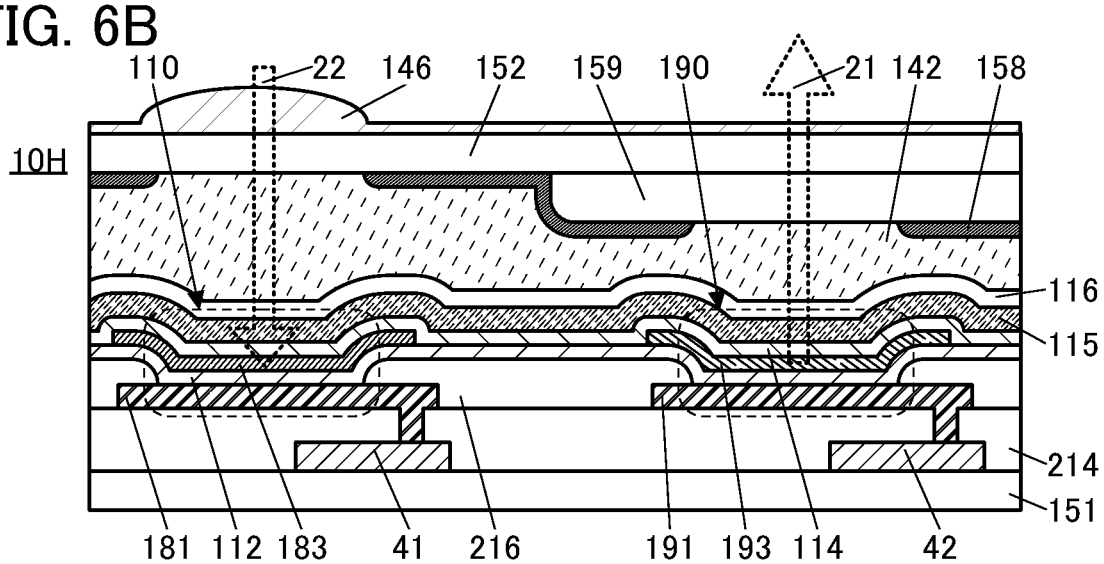

FIG. 5C is a cross-sectional view of a display apparatus 10F. FIG. 6A is a cross-sectional view of a display apparatus 10G. FIG. 6B is a cross-sectional view of a display apparatus 10H.

The display apparatus 10F includes a lens 149 in addition to the components of the display apparatus 10D.

The display apparatus of this embodiment may include the lens 149. The lens 149 is provided at the position overlapping with the light-receiving device 110. In the display apparatus 10F, the lens 149 is provided in contact with the substrate 152. The lens 149 included in the display apparatus 10F has a convex surface on the substrate 151 side.

In the case where the light-blocking layer 158 and the lens 149 are formed on the same surface of the substrate 152, their formation order is not limited. FIG. 5C illustrates an example in which the lens 149 is formed first; alternatively, the light-blocking layer 158 may be formed first. In FIG. 5C, an end portion of the lens 149 is covered with the light-blocking layer 158.

In the display apparatus 10F, the light 22 enters the light-receiving device 110 through the lens 149. With the lens 149, the imaging range of the light-receiving device 110 can be narrowed as compared to the case where the lens 149 is not provided, thereby inhibiting overlap between the imaging ranges of the adjacent light-receiving devices 110. Thus, a clear image with little blurring can be captured. Given that the imaging range of the light-receiving device 110 does not change, the lens 149 allows the size of a pinhole (corresponding to the size of an opening in the light-blocking layer 158 that overlaps with the light-receiving device 110 in FIG. 5C) to be increased, compared to the case where the lens 149 is not provided. Hence, providing the lens 149 can increase the amount of light entering the light-receiving device 110.

Like the display apparatus 10F, the display apparatus 10G illustrated in FIG. 6A has a structure in which the light 22 enters the light-receiving device 110 through the lens 149.

In the display apparatus 10G, the lens 149 is provided in contact with a top surface of the protective layer 116. The lens 149 included in the display apparatus 10G has a convex surface on the substrate 152 side.

In the display apparatus 10H illustrated in FIG. 6B, a lens array 146 is provided on the display surface side of the substrate 152. A lens included in the lens array 146 is provided at the position overlapping with the light-receiving device 110. The light-blocking layer 158 is preferably provided on the surface of the substrate 152 on the substrate 151 side.

As a method for forming the lens used in the display apparatus of this embodiment, a lens such as a microlens may be formed directly over the substrate or the light-receiving device, or a lens array formed separately, such as a microlens array, may be attached to the substrate.

The lens preferably has a refractive index of greater than or equal to 1.3 and less than or equal to 2.5. The lens can be formed using at least one of an inorganic material and an organic material. For example, a material containing a resin can be used for the lens. Moreover, a material containing at least one of an oxide and a sulfide can be used for the lens.

Specifically, a resin containing chlorine, bromine, or iodine, a resin containing a heavy metal atom, a resin having an aromatic ring, a resin containing sulfur, and the like can be used for the lens. Alternatively, a material containing a resin and nanoparticles of a material having a higher refractive index than the resin can be used for the lens. Titanium oxide, zirconium oxide, or the like can be used for the nanoparticles.

In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, and the like can be used for the lens. Alternatively, zinc sulfide and the like can be used for the lens.

[Display Apparatus 10J]

Figure 6C:
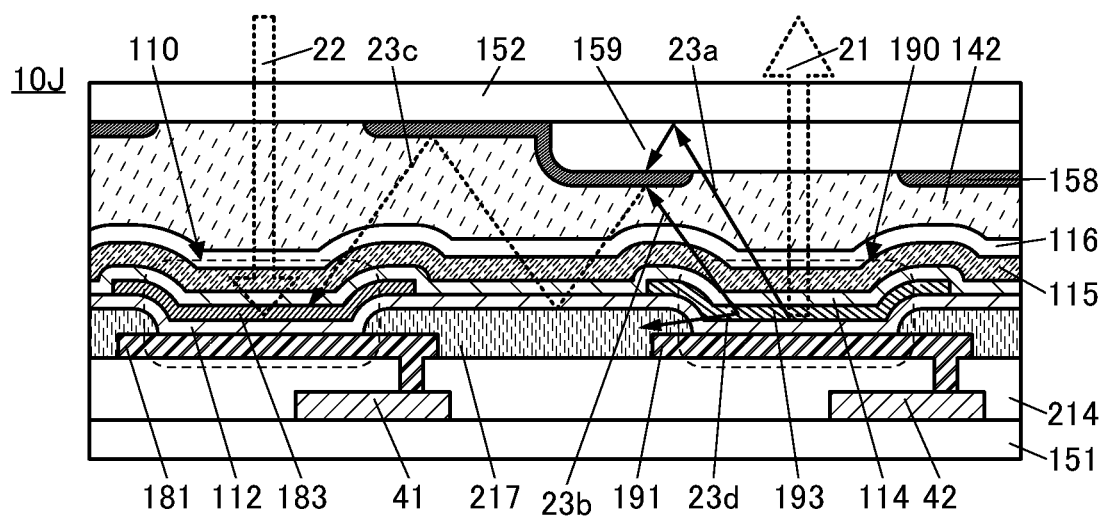

FIG. 6C is a cross-sectional view of a display apparatus 10J.

The display apparatus 10J is different from the display apparatus 10D in that the display apparatus 10J does not include the partition 216 that transmits visible light but includes the partition 217 that blocks visible light.

The partition 217 preferably absorbs light emitted from the light-emitting device 190. As the partition 217, a black matrix can be formed using a resin material containing a pigment or dye, for example. Moreover, the partition 217 can be formed of a colored insulating layer by using a brown resist material.

In the display apparatus 10D (FIG. 5A), in some cases, light emitted from the light-emitting device 190 is reflected by the substrate 152 and the partition 216, and the reflected light enters the light-receiving device 110. In other cases, light emitted from the light-emitting device 190 passes through the partition 216 and is reflected by the transistor, a wiring, or the like, and thus the reflected light enters the light-receiving device 110. In the display apparatus 10J, such reflected light can be prevented from entering the light-receiving device 110 because light is absorbed by the partition 217. Hence, noise can be reduced, and the sensitivity of the sensor using the light-receiving device 110 can be increased.

The partition 217 preferably absorbs at least a wavelength of light that is sensed by the light-receiving device 110. For example, in the case where the light-receiving device 110 senses green light emitted from the light-emitting device 190, the partition 217 preferably absorbs at least green light. For example, when the partition 217 includes a red color filter, the partition 217 can absorb green light and thus reflected light can be prevented from entering the light-receiving device 110.

Although the light-blocking layer 158 can absorb most of the stray light 23b before the stray light 23b reaches the resin layer 159, part of the stray light 23b is sometimes reflected and enter the partition 217. When the partition 217 is configured to absorb the stray light 23b, the stray light 23b can be prevented from entering the transistor, the wiring, or the like. Thus, stray light 23c can be prevented from reaching the light-receiving device 110. With a larger number of times the stray light 23b strikes the light-blocking layer 158 and the partition 217, the amount of absorbed light can be increased and the amount of the stray light 23c reaching the light-receiving device 110 can be extremely small. The resin layer 159 is preferably thick, in which case the number of times the stray light 23b strikes the light-blocking layer 158 and the partition 217 can be increased.

Since the partition 217 absorbs light, stray light 23d that enters the partition 217 directly from the light-emitting device 190 can be absorbed by the partition 217. This also demonstrates that providing the partition 217 can reduce the amount of stray light incident on the light-receiving device 110.

[Display Apparatus 10K]

Figure 7A:
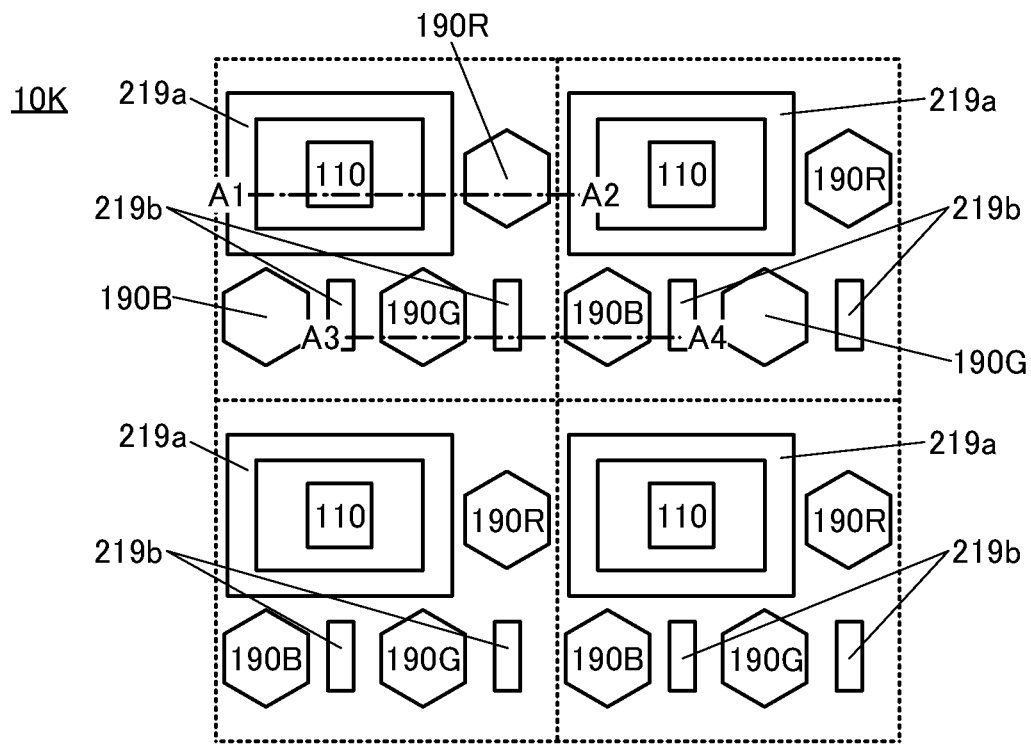
FIG. 7A is a top view illustrating an example of a display apparatus.
Figure 7B:
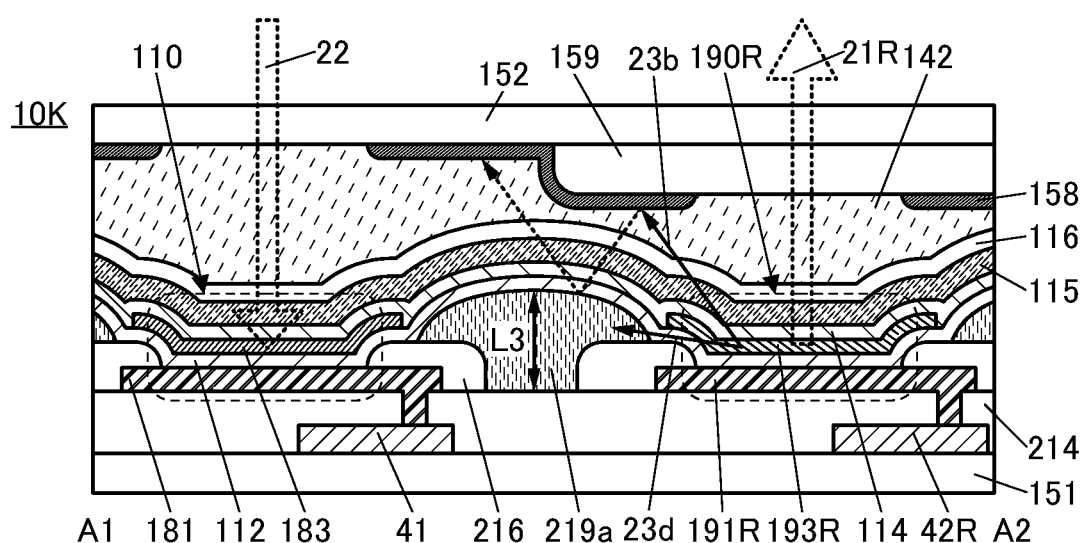
FIG. 7B is a cross-sectional view illustrating an example of the display apparatus.
Figure 8A:
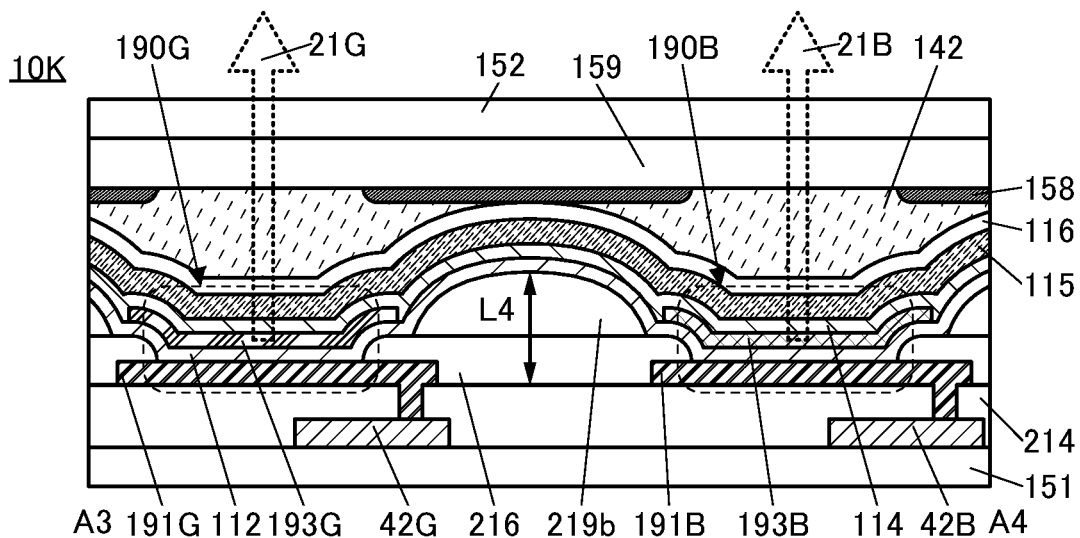
FIG. 8A and FIG. 8B are cross-sectional views each illustrating an example of the display apparatus.

FIG. 7A is a top view of a display apparatus 10K. FIG. 7B is a cross-sectional view along the dashed-dotted line A1-A2 in FIG. 7A. FIG. 8A is a cross-sectional view along the dashed-dotted line A3-A4 in FIG. 7A.

In FIG. 7A, a portion surrounded by a dotted frame corresponds to one pixel. One pixel includes the light-receiving device 110, a red light-emitting device 190R, a green light-emitting device 190G, and a blue light-emitting device 190B.

There is no particular limitation on the top surface shapes of the light-receiving device 110 and the light-emitting devices 190R, 190G, and 190B. In the pixel layout illustrated in FIG. 7A, a hexagonal close-packed arrangement is employed. The hexagonal close-packed arrangement is preferable because the aperture ratios of the light-receiving device 110 and the light-emitting devices 190R, 190G, and 190 can be increased. In the top view, the light-emitting region of the light-receiving device 110 is quadrilateral, and the light-emitting region of each of the light-emitting devices 190R, 190G, and 190B is hexagonal.

In the top view (also referred to as plan view), the light-receiving device 110 is provided on the inner side of a frame-shaped light-blocking layer 219a. The four sides of the light-receiving device 110 are completely surrounded by the light-blocking layer 219a, thereby inhibiting entry of stray light into the light-receiving device 110. Note that the frame-shaped light-blocking layer 219a may have a gap (also referred to as a space, a disconnected portion, or a missing portion).

In the top view, a spacer 219b is provided between the green light-emitting device 190G and the blue light-emitting device 190B.

As illustrated in FIG. 7B and FIG. 8A, the display apparatus 10K includes the light-receiving device 110, the red light-emitting device 190R, the green light-emitting device 190G, and the blue light-emitting device 190B.

The light-emitting device 190R includes a pixel electrode 191R, the common layer 112, a light-emitting layer 193R, the common layer 114, and the common electrode 115. The light-emitting layer 193R contains an organic compound that emits red light 21R. The light-emitting device 190R has a function of emitting red light.

The light-emitting device 190G includes a pixel electrode 191G, the common layer 112, a light-emitting layer 193G, the common layer 114, and the common electrode 115. The light-emitting layer 193G contains an organic compound that emits green light 21G. The light-emitting device 190G has a function of emitting green light.

The light-emitting device 190B includes a pixel electrode 191B, the common layer 112, a light-emitting layer 193B, the common layer 114, and the common electrode 115. The light-emitting layer 193B contains an organic compound that emits blue light 21B. The light-emitting device 190B has a function of emitting blue light.

The light-receiving device 110 includes the pixel electrode 181, the common layer 112, the active layer 183, the common layer 114, and the common electrode 115. The active layer 183 contains an organic compound. The light-receiving device 110 has a function of sensing visible light.

In the display apparatus 10K, the light-receiving device 110, the light-emitting device 190R, the light-emitting device 190G, the light-emitting device 190B, the transistor 41, a transistor 42R, a transistor 42G, a transistor 42B, and the like are provided between a pair of substrates (the substrate 151 and the substrate 152).

End portions of the pixel electrodes 181, 191R, 191G, and 191B are covered with the partition 216.

The pixel electrode 181 is electrically connected to the source or the drain of the transistor 41 through an opening provided in the insulating layer 214. The pixel electrode 191R is electrically connected to a source or a drain of the transistor 42R through an opening provided in the insulating layer 214. Similarly, the pixel electrode 191G is electrically connected to a source or a drain of the transistor 42G through an opening provided in the insulating layer 214. The pixel electrode 191B is electrically connected to a source or a drain of the transistor 42B through an opening provided in the insulating layer 214.

The light-receiving device 110 and the light-emitting devices 190R, 190G, and 190B are covered with the protective layer 116.

The resin layer 159 is provided on a surface of the substrate 152 on the substrate 151 side. The resin layer 159 is provided at the positions overlapping with the light-emitting devices 190R, 190G, and 190B and is not provided at the position overlapping with the light-receiving device 110.

The light-blocking layer 158 is provided on the surfaces of the substrate 152 and the resin layer 159 on the substrate 151 side. The light-blocking layer 158 has openings at the positions overlapping with the light-emitting devices 190R, 190G, and 190B and at the position overlapping with the light-receiving device 110.

In the top view, a frame-shaped opening is provided in the partition 216. In FIG. 7B, the partition 216 has an opening between the light-receiving device 110 and the light-emitting device 190R. The light-blocking layer 219a is provided to cover the opening. The light-blocking layer 219a preferably covers the opening of the partition 216 and a side surface of the partition 216 exposed in the opening. Furthermore, the light-blocking layer 219a preferably covers at least part of a top surface of the partition 216.

Although the light-blocking layer 219a can be provided over the partition 216 that is not provided with an opening, there is a possibility that stray light passes through the partition 216 and enters the light-receiving device 110. When the partition 216 is provided with an opening and the light-blocking layer 219a is provided to fill the opening, stray light that passes through the partition 216 is absorbed by the light-blocking layer 219a in the opening of the partition 216. This can inhibit entry of stray light into to the light-receiving device 110.

The light-blocking layer 219a preferably has a forward tapered shape. This can improve the coverage with the films provided over the light-blocking layer 219a (e.g., the common layer 112, the common layer 114, the common electrode 115, and the protective layer 116).

The light-blocking layer 219a preferably absorbs at least a wavelength of light that is sensed by the light-receiving device 110. For example, in the case where the light-receiving device 110 senses green light emitted from the light-emitting device 190G, the light-blocking layer 219a preferably absorbs at least green light. For example, when the light-blocking layer 219a includes a red color filter, the light-blocking layer 219a can absorb green light and thus reflected light can be prevented from entering the light-receiving device 110. The light-blocking layer 219a may be a black matrix formed using a resin material containing a pigment or dye, for example. The light-blocking layer 219a may have a stacked-layer structure of a red color filter, a green color filter, and a blue color filter. Alternatively, as the light-blocking layer 219a, a colored insulating layer may be formed using a brown resist material.

For example, when the light-receiving device 110 senses green light emitted from the light-emitting device 190G, in some cases, light emitted from the light-emitting device 190G is reflected by the substrate 152 and the partition 216, and the reflected light enters the light-receiving device 110. In other cases, light emitted from the light-emitting device 190G passes through the partition 216 and is reflected by the transistor, the wiring, or the like, and thus the reflected light enters the light-receiving device 110. In the display apparatus 10K, such reflected light can be prevented from entering the light-receiving device 110 because light is absorbed by the light-blocking layer 158 and the light-blocking layer 219a. Hence, noise can be reduced, and the sensitivity of the sensor using the light-receiving device 110 can be increased.

For example, the light-blocking layer 158 can absorb most of the stray light 23b before the stray light 23b reaches the resin layer 159. Furthermore, even when part of the stray light 23b is reflected by the light-blocking layer 158, the light-blocking layer 219a absorbs the stray light 23b, thereby inhibiting entry of the stray light 23b into the transistor, the wiring, or the like. Thus, stray light can be prevented from reaching the light-receiving device 110. With a larger number of times the stray light 23b strikes the light-blocking layer 158 and the light-blocking layer 219a, the amount of absorbed light can be increased and the amount of stray light reaching the light-receiving device 110 can be extremely small. The resin layer 159 is preferably thick, in which case the number of times the stray light 23b strikes the light-blocking layer 158 and the light-blocking layer 219a can be increased. The thick resin layer 159 is also preferable in terms of an improvement in display quality, because a shorter distance from the light-blocking layer 158 to the light-emitting device of each color can reduce viewing angle dependence of display.

Since the light-blocking layer 219a absorbs light, the stray light 23d that enters the light-blocking layer 219a directly from the light-emitting device can be absorbed by the light-blocking layer 219a. This also demonstrates that providing the light-blocking layer 219a can reduce the amount of stray light incident on the light-receiving device 110.

Providing the light-blocking layer 158 can control the range where the light-receiving device 110 senses light. When the distance from the light-blocking layer 158 to the light-receiving device 110 is long, the imaging range is narrowed, and the imaging resolution can be increased.

The spacer 219b is positioned over the partition 216, and is positioned between the light-emitting device 190G and the light-emitting device 190B in the top view. A top surface of the spacer 219b is preferably closer to the light-blocking layer 158 than a top surface of the light-blocking layer 219a is. When a thickness L3 of the light-blocking layer 219a is greater than or equal to a total thickness L4 of the partition 216 and the spacer 219b, the inside of the frame-shaped light-blocking layer 219a is not sufficiently filled with the adhesive layer 142 in some cases, which might reduce the reliability of the light-receiving device 110 or even the reliability of the display apparatus 10K. Therefore, the total thickness L4 of the partition 216 and the spacer 219b is preferably larger than the thickness L3 of the light-blocking layer 219a, which allows easy filling with the adhesive layer 142. As illustrated in FIG. 8A, the light-blocking layer 158 may be in contact with the protective layer 116 (or the common electrode 115) in a portion where the spacer 219b and the light-blocking layer 158 overlap with each other.

[Display Apparatus 10L]

Figure 8B:
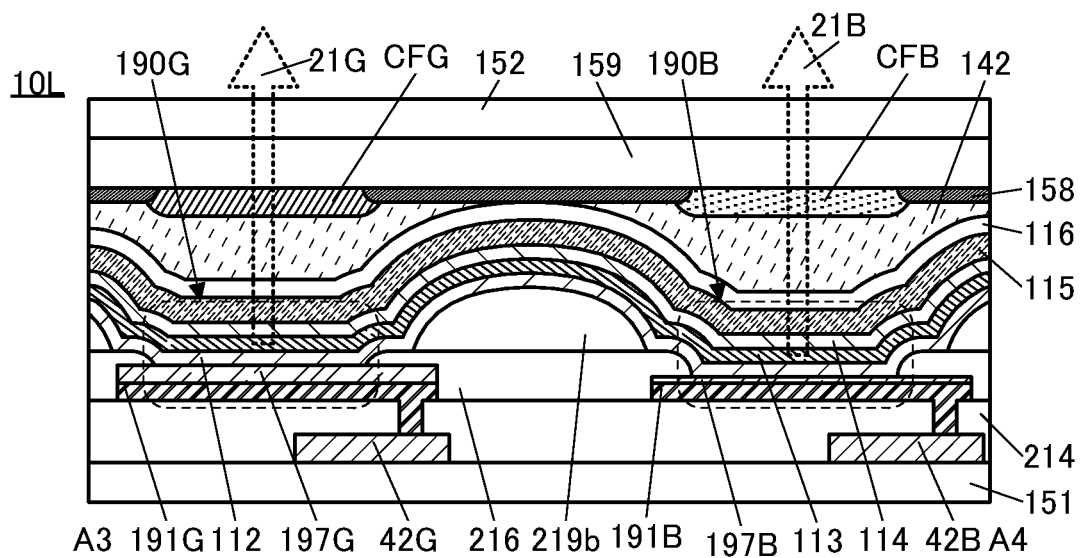

FIG. 8B is a cross-sectional view of a display apparatus 10L.

In the display apparatus 10L, the light-emitting devices 190R, 190G, and 190B include the same light-emitting layer. FIG. 8B corresponds to a cross-sectional view along the dashed-dotted line A3-A4 in FIG. 7A.

The light-emitting device 190G in FIG. 8B includes the pixel electrode 191G, an optical adjustment layer 197G, the common layer 112, the light-emitting layer 113, the common layer 114, and the common electrode 115. The light-emitting device 190B in FIG. 8B includes the pixel electrode 191B, an optical adjustment layer 197B, the common layer 112, the light-emitting layer 113, the common layer 114, and the common electrode 115. The common layer 112, the light-emitting layer 113, and the common layer 114 are common components between the light-emitting devices 190R, 190G, and 190B. The light-emitting layer 113 includes, for example, the light-emitting layer 193R that emits red light, the light-emitting layer 193G that emits green light, and the light-emitting layer 193B that emits blue light.

Although the common layer 112, the light-emitting layer 113, and the common layer 114 are illustrated as the EL layer in FIG. 8B, this embodiment is not limited thereto. The light-emitting device may have a single structure in which one a light-emitting unit is provided between the pixel electrode 191 and the common electrode 115, or a tandem structure in which a plurality of light-emitting units are provided between the pixel electrode 191 and the common electrode 115.

The light-emitting layer 113 is shared by the light-emitting devices that emit light of different colors. Light emitted from the light-emitting device 190G is extracted as the green light 21G through a coloring layer CFG. Light emitted from the light-emitting device 190B is extracted as the blue light 21B through a coloring layer CFB.

The light-emitting device 190G and the light-emitting device 190B have the same structure except that they include optical adjustment layers with different thicknesses. A reflective electrode is used as the pixel electrode 191G and the pixel electrode 191B. As the optical adjustment layer, a transparent electrode over the reflective electrode can be used. The light-emitting elements of different colors preferably each have the optical adjustment layer 197 with a different thickness from one another. The light-emitting device 190G illustrated in FIG. 8B has been optically adjusted using the optical adjustment layer 197G so that the optical path length between the pixel electrode 191G and the common electrode 115 intensifies green light. Similarly, the light-emitting device 190B has been optically adjusted using the optical adjustment layer 197B so that the optical path length between the pixel electrode 191B and the common electrode 115 intensifies blue light.

[Display Apparatus 10M]

Figure 9A:
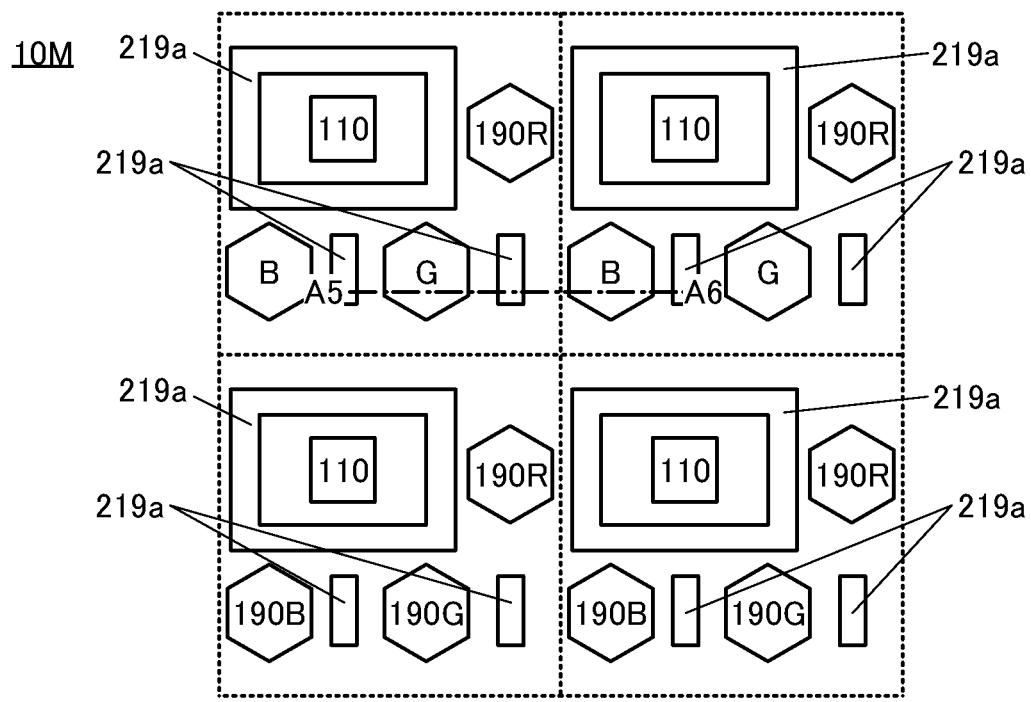
FIG. 9A is a top view illustrating an example of a display apparatus.
Figure 9B:
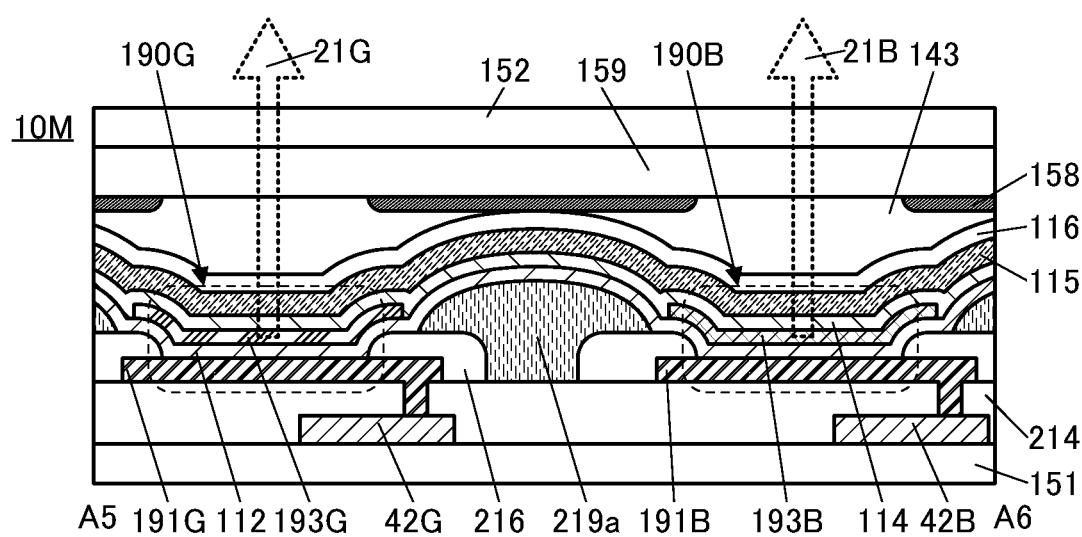
FIG. 9B is a cross-sectional view illustrating an example of the display apparatus.

FIG. 9A is a top view of a display apparatus 10M. FIG. 9B is a cross-sectional view along the dashed-dotted line A5-A6 in FIG. 9A.

The display apparatus 10M illustrated in FIG. 9A and FIG. 9B is different from the display apparatus 10K illustrated in FIG. 7A, FIG. 7B, and FIG. 8A in including the light-blocking layer 219a between the green light-emitting device 190G and the blue light-emitting device 190B and employing a hollow sealing structure in which a space 143 is filled with an inert gas.

As in the display apparatus 10M, the light-blocking layer 219a may be provided both between the light-emitting device 190R and the light-receiving device 110 and between the light-emitting device 190G and the light-emitting device 190B.

[Display Apparatus 10N]

Figure 10A:
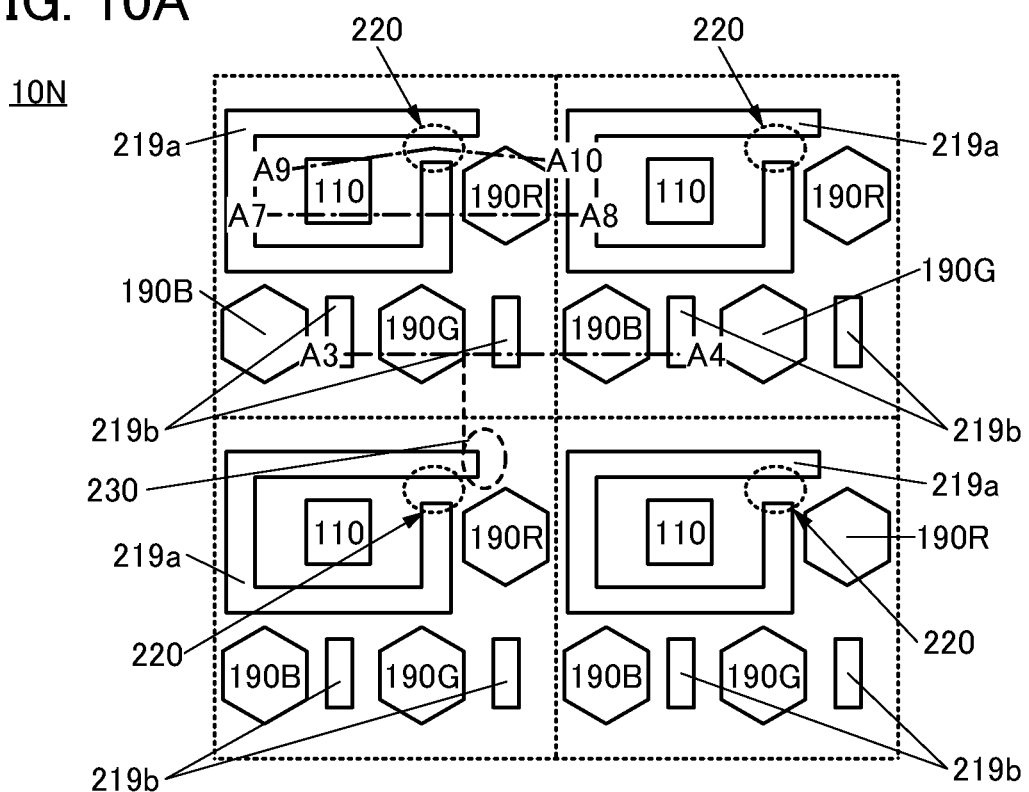
FIG. 10A is a top view illustrating an example of a display apparatus.
Figure 10B:
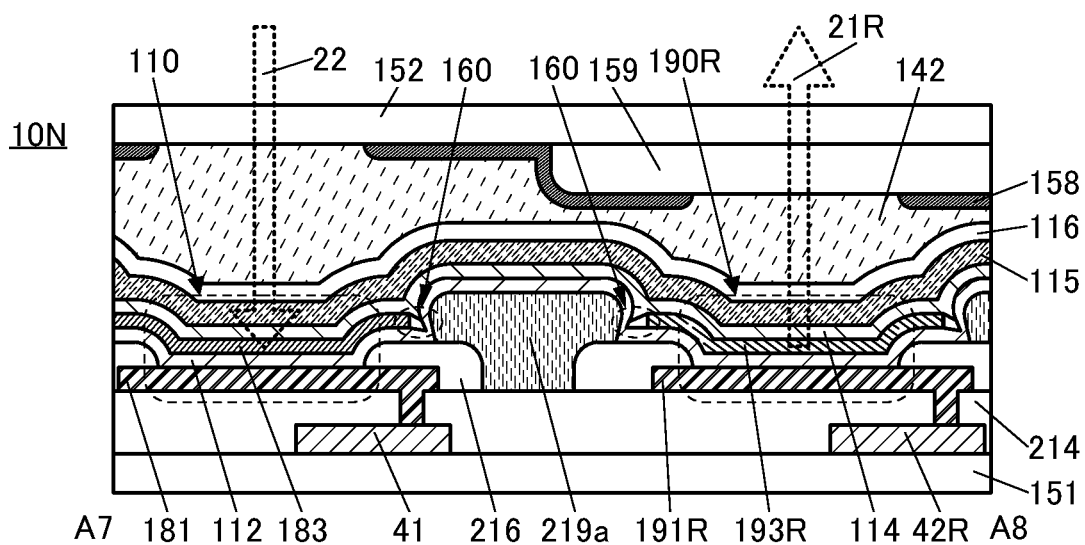
FIG. 10B is a cross-sectional view illustrating an example of the display apparatus.
Figure 11A:
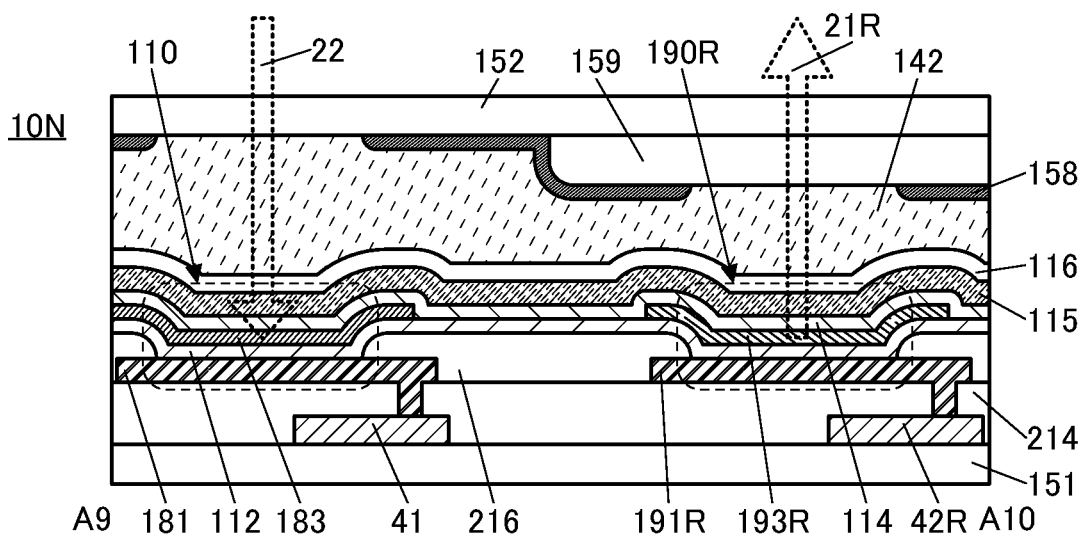
FIG. 11A and FIG. 11B are cross-sectional views each illustrating an example of a display apparatus.

FIG. 10A is a top view of a display apparatus 10N. FIG. 10B is a cross-sectional view along the dashed-dotted line A7-A8 in FIG. 10A. FIG. 11A is a cross-sectional view along the dashed-dotted line A9-A10 in FIG. 10A.

As a cross-sectional structure of the display apparatus 10N (FIG. 10A) along the dashed-dotted line A3-A4, a structure similar to that of the display apparatus 10K (FIG. 8A) can be employed. Alternatively, a structure similar to that of the display apparatus 10M (FIG. 9B) may be employed.

The top surface shape and the cross-sectional shape of the light-blocking layer 219a in the display apparatus 10N are different from those in the display apparatus 10K (FIG. 7A and FIG. 7B).

In the top view (also referred to as plan view), the light-blocking layer 219a surrounds the four sides of the light-receiving device 110 and has one end and the other end apart from each other. A gap 220 (also referred to as space, disconnected portion, or missing portion) of the light-blocking layer 219a is positioned close to the red light-emitting device 190R. In the case where only a light-emitting device that emits light of a specific color is used as a light source for sensing, the gap 220 of the light-blocking layer 219a is preferably positioned on the side of a light-emitting device different from the light-emitting device used for the sensing. For example, the display apparatus 10N is preferably configured to perform sensing with the use of the green light-emitting device 190G or the blue light-emitting device 190B. Thus, an influence of noise in the sensing can be suppressed. Moreover, in the case where sensing is performed using the green light-emitting device 190G, it is preferred that one end of the light-blocking layer 219a extend toward the red light-emitting device 190R more than toward the green light-emitting device 190G, as illustrated in a region 230. Accordingly, stray light from the green light-emitting device 190G can be prevented from entering the light-receiving device 110 through the gap 220.

The partition 216 has an opening between the light-receiving device 110 and the light-emitting device 190R. The light-blocking layer 219a is provided to cover the opening. The light-blocking layer 219a preferably covers the opening of the partition 216 and a side surface of the partition 216 exposed in the opening. Furthermore, the light-blocking layer 219a preferably covers at least part of the top surface of the partition 216.

The light-blocking layer 219a may have an inversely tapered shape. The organic film and the common electrode 115 that are provided over the inversely tapered light-blocking layer 219a may be thin near a side surface of the light-blocking layer 219a. Furthermore, a space 160 is sometimes generated near the side surface of the light-blocking layer 219a.

Here, if the light-blocking layer 219a surrounds all the four sides of the light-receiving device 110 in the top view, the common electrode 115 might be broken due to the light-blocking layer 219a and separated into a portion on the inner side of the light-blocking layer 219a and a portion on the outer side thereof. In view of this, the gap 220 is provided by making the light-blocking layer 219a have a top surface shape such that the light-blocking layer 219a surrounds the four sides of the light-receiving device 110 and its one end is apart from the other end; hence, separation of the common electrode 115 can be inhibited. Consequently, a display defect in the display apparatus 10N can be inhibited.

FIG. 11A is a cross-sectional view including the gap 220 of the light-blocking layer 219a. In the top view, the partition 216 has an opening that surrounds the four sides of the light-receiving device 110 and has one end and the other end apart from each other in a manner similar to the top surface shape of the light-blocking layer 219a. In the gap 220 of the light-blocking layer 219a, the common layer 112, the common layer 114, the common electrode 115, and the protective layer 116 are provided in this order over the partition 216.

[Display Apparatus 10P]

Figure 11B:
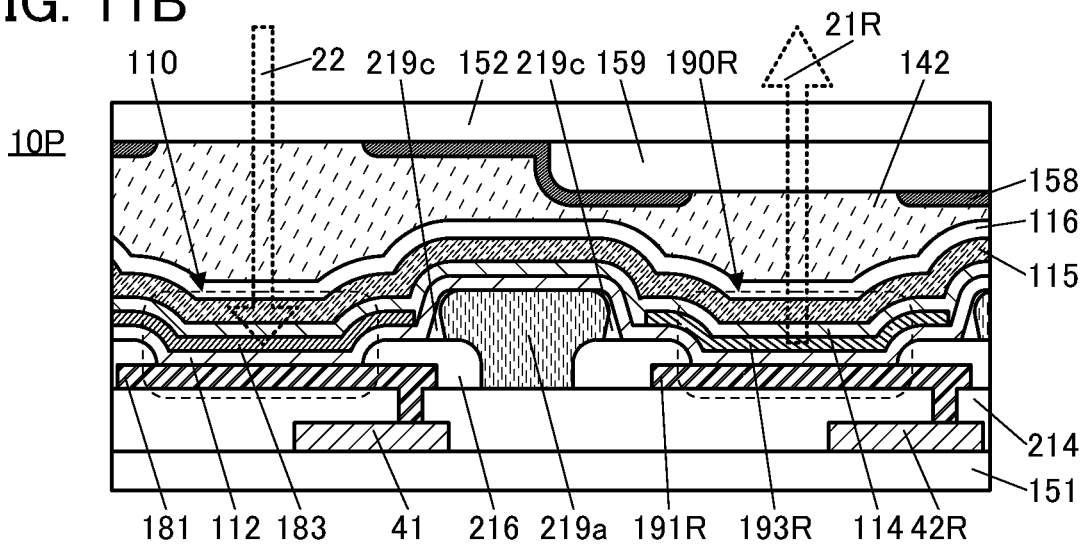

FIG. 11B is a cross-sectional view of a display apparatus 10P.

The display apparatus 10P is different from the display apparatus 10N in including a sidewall 219c in contact with a side surface of the light-blocking layer 219a.

In the display apparatus 10P, the top surface of the light-blocking layer 219a may have a frame shape as illustrated in FIG. 7A or may have the gap 220 as illustrated in FIG. 10A.

Providing the sidewall 219c in contact with the side surface of the inversely tapered light-blocking layer 219a makes it possible to improve the coverage with the organic film, the common electrode 115, and the like and increase the display quality of the display apparatus. Improvement of the coverage with the common electrode 115 can prevent breakage or even thickness reduction of the common electrode 115, thereby inhibiting display luminance unevenness due to a voltage drop of the common electrode 115.

The sidewall 219c can be formed using a material that can be used for the partition 216.

[Display Apparatus 10Q]

Figure 12A:
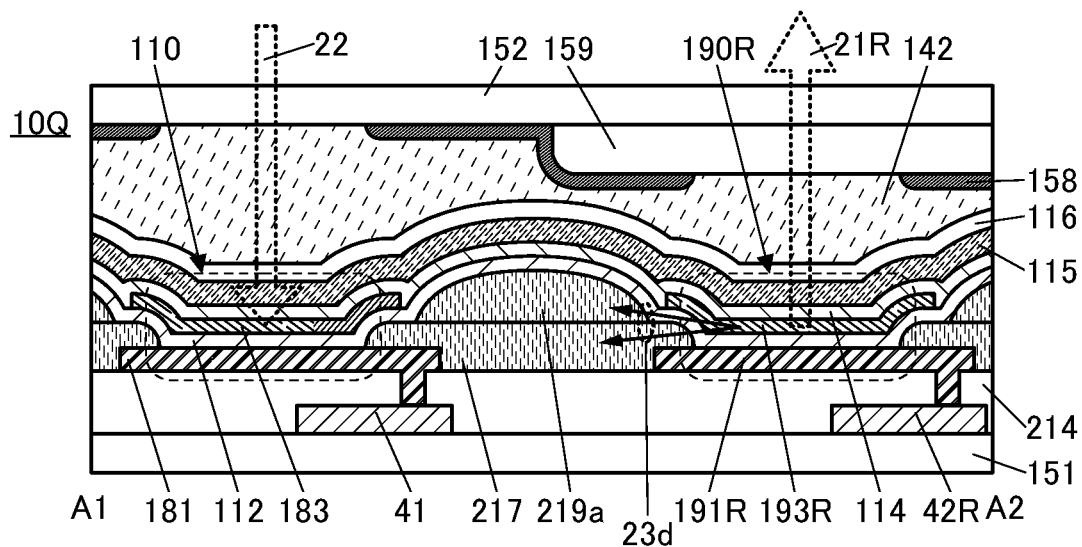
FIG. 12A and FIG. 12B are cross-sectional views each illustrating an example of a display apparatus.
Figure 12B:
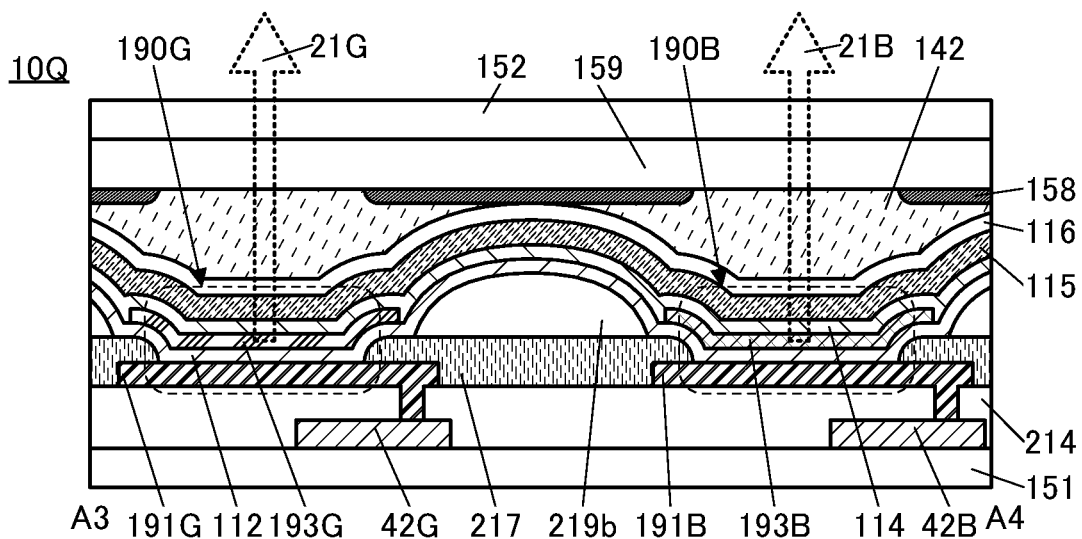

FIG. 12A and FIG. 12B are cross-sectional views of a display apparatus 10Q. The display apparatus 10Q can have a top surface structure similar to that of the display apparatus 10K (FIG. 7A). FIG. 12A is a cross-sectional view along the dashed-dotted line A1-A2 in FIG. 7A. FIG. 12B is a cross-sectional view taken along the dashed-dotted line A3-A4 in FIG. 7A.

The display apparatus 10Q differs from the display apparatus 10K mainly in that the display apparatus 10Q does not include the partition 216 and includes the partition 217.

The light-blocking layer 219a is positioned over the partition 217. Unlike the partition 216, the partition 217 can absorb light emitted from the light-emitting device; hence, an opening does not need to be formed in the partition 217. The stray light 23d that enters the partition 217 from the light-emitting device is absorbed by the partition 217. The stray light 23d that enters the light-blocking layer 219a from the light-emitting device is absorbed by the light-blocking layer 219a.

The spacer 219b is positioned between the light-emitting device 190G and the light-emitting device 190B. The top surface of the spacer 219b is preferably closer to the light-blocking layer 158 than the top surface of the light-blocking layer 219a is. When the spacer 219b is thinner than the light-blocking layer 219a, the inside of the frame-shaped light-blocking layer 219a is not sufficiently filled with the adhesive layer 142 in some cases, which might reduce the reliability of the light-receiving device 110 or even the reliability of the display apparatus 10Q. Therefore, the spacer 219b is preferably thicker than the light-blocking layer 219a, which allows easy filling with the adhesive layer 142. As illustrated in FIG. 12B, the light-blocking layer 158 may be in contact with the protective layer 116 (or the common electrode 115) in a portion where the spacer 219b and the light-blocking layer 158 overlap with each other.

A more detailed structure of the display apparatus of one embodiment of the present invention will be described below with reference to FIG. 13 to FIG. 17.

[Display Apparatus 100A]

Figure 13:
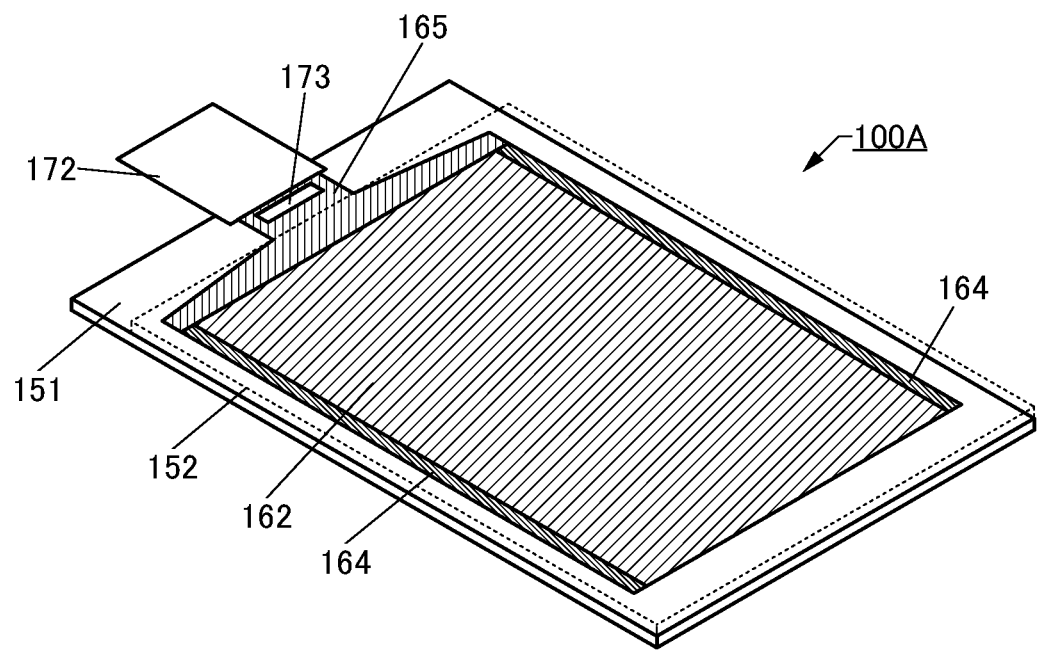
FIG. 13 is a perspective view illustrating an example of a display apparatus.
Figure 14:
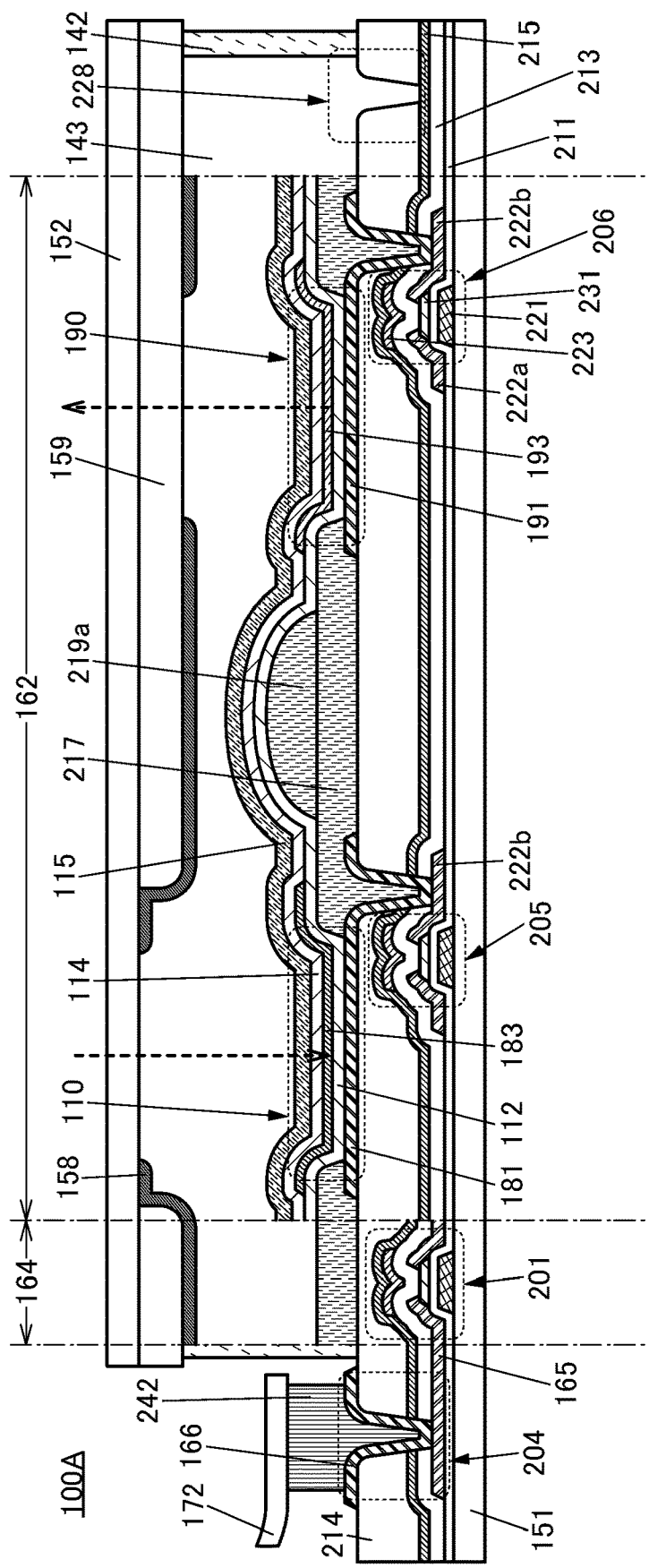
FIG. 14 is a cross-sectional view illustrating an example of the display apparatus.
Figure 15:
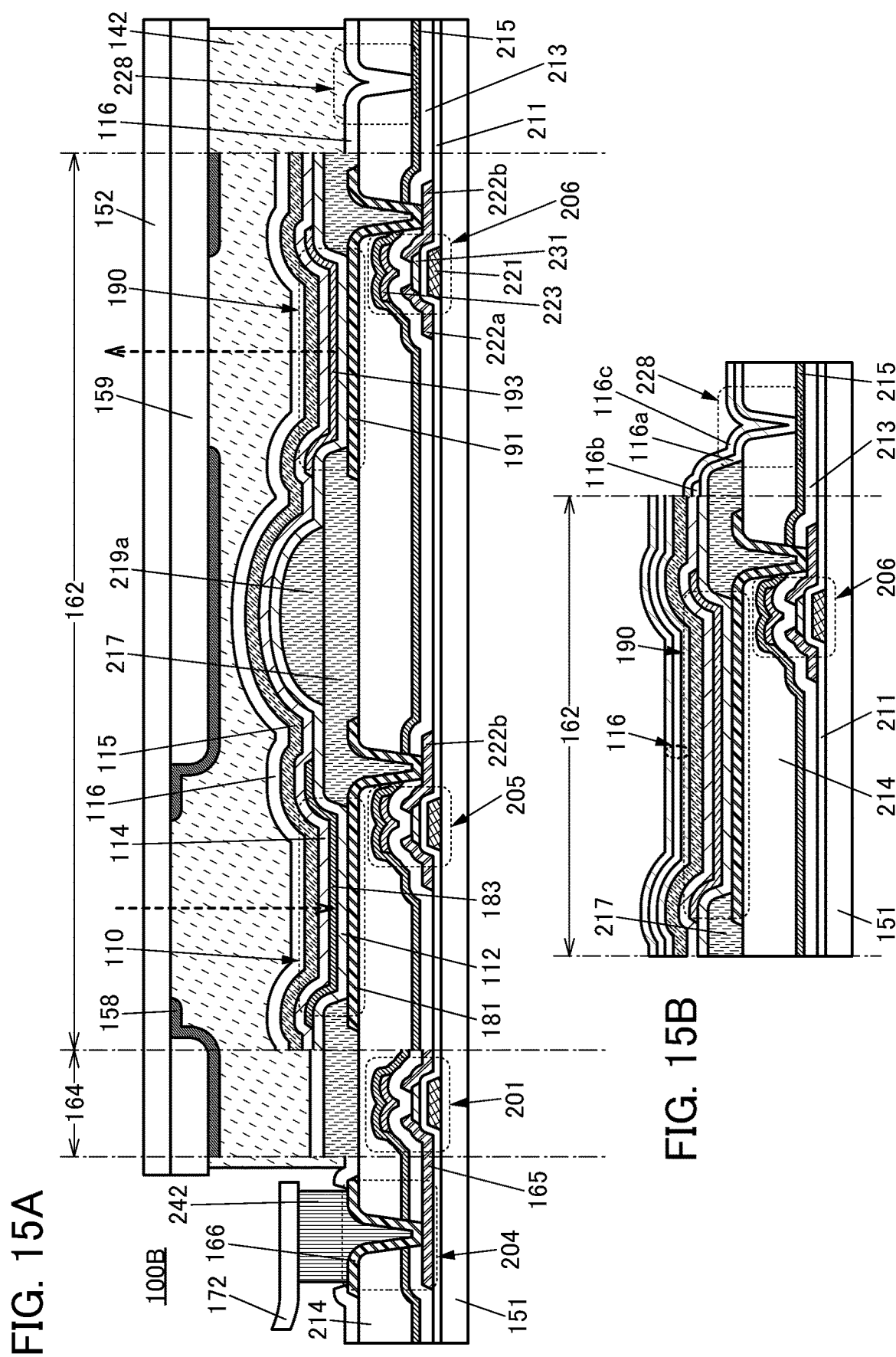
FIG. 15A and FIG. 15B are cross-sectional views illustrating an example of a display apparatus.

FIG. 13 is a perspective view of a display apparatus 100A, and FIG. 14 is a cross-sectional view of the display apparatus 100A.

In the display apparatus 100A, the substrate 152 and the substrate 151 are attached to each other. In FIG. 13, the substrate 152 is denoted by a dashed line.

The display apparatus 100A includes a display portion 162, a circuit 164, a wiring 165, and the like. FIG. 13 illustrates an example in which an integrated circuit (IC) 173 and an FPC 172 are mounted on the display apparatus 100A. Thus, the structure illustrated in FIG. 13 can be regarded as a display module including the display apparatus 100A, the IC, and the FPC.

As the circuit 164, a scan line driver circuit can be used, for example.

The wiring 165 has a function of supplying a signal and power to the display portion 162 and the circuit 164. The signal and power are input to the wiring 165 from the outside through the FPC 172 or from the IC 173.

FIG. 13 illustrates an example in which the IC 173 is provided over the substrate 151 by a COG (chip on glass) method, a COF (chip on film) method, or the like. An IC including a scan line driver circuit, a signal line driver circuit, or the like can be used as the IC 173, for example. Note that the display apparatus 100A and the display module may have a structure not including an IC. The IC may be mounted on the FPC by a COF method or the like.

FIG. 14 illustrates an example of cross sections of part of a region including the FPC 172, part of the circuit 164, part of the display portion 162, and part of a region including an end portion of the display apparatus 100A.

The display apparatus 100A illustrated in FIG. 14 includes a transistor 201, a transistor 205, a transistor 206, the light-emitting device 190, the light-receiving device 110, and the like between the substrate 151 and the substrate 152.

The resin layer 159 and the insulating layer 214 adhere to each other with the adhesive layer 142 therebetween. A solid sealing structure, a hollow sealing structure, or the like can be employed to seal the light-emitting device 190 and the light-receiving device 110. In FIG. 14, a hollow sealing structure is employed in which the space 143 surrounded by the substrate 152, the adhesive layer 142, and the substrate 151 is filled with an inert gas (e.g., nitrogen or argon). The adhesive layer 142 may be provided to overlap with the light-emitting device 190 and the light-receiving device 110. The space 143 surrounded by the substrate 152, the adhesive layer 142, and the substrate 151 may be filled with a resin different from that of the adhesive layer 142.

The light-emitting device 190 has a stacked-layer structure in which the pixel electrode 191, the common layer 112, the light-emitting layer 193, the common layer 114, and the common electrode 115 are stacked in this order from the insulating layer 214 side. The pixel electrode 191 is connected to a conductive layer 222b included in the transistor 206 through an opening provided in the insulating layer 214.

An end portion of the pixel electrode 191 is covered with the partition 217. The pixel electrode 191 contains a material that reflects visible light, and the common electrode 115 contains a material that transmits visible light.

The light-receiving device 110 has a stacked-layer structure in which the pixel electrode 181, the common layer 112, the active layer 183, the common layer 114, and the common electrode 115 are stacked in this order from the insulating layer 214 side. The pixel electrode 181 is electrically connected to the conductive layer 222b included in the transistor 205 through an opening provided in the insulating layer 214. An end portion of the pixel electrode 181 is covered with the partition 217. The pixel electrode 181 contains a material that reflects visible light, and the common electrode 115 contains a material that transmits visible light.

Light from the light-emitting device 190 is emitted toward the substrate 152. Light enters the light-receiving device 110 through the substrate 152 and the space 143. For the substrate 152, a material having a high visible-light-transmitting property is preferably used.

The pixel electrode 181 and the pixel electrode 191 can be formed using the same material in the same step. The common layer 112, the common layer 114, and the common electrode 115 are used in both the light-receiving device 110 and the light-emitting device 190. The light-receiving device 110 and the light-emitting device 190 can have common components except the active layer 183 and the light-emitting layer 193. Thus, the light-receiving device 110 can be incorporated into the display apparatus 100A without a significant increase in the number of manufacturing steps.

The resin layer 159 and the light-blocking layer 158 are provided on a surface of the substrate 152 on the substrate 151 side. The resin layer 159 is provided at the position overlapping with the light-emitting device 190 and is not provided at the position overlapping with the light-receiving device 110. The light-blocking layer 158 is provided to cover the surface of the substrate 152 on the substrate 151 side, a side surface of the resin layer 159, and a surface of the resin layer 159 on the substrate 151 side. The light-blocking layer 158 has an opening at the position overlapping with the light-receiving device 110 and an opening at the position overlapping with the light-emitting device 190. Providing the light-blocking layer 158 can control the range where the light-receiving device 110 senses light. Moreover, providing the light-blocking layer 158 can inhibit direct entry of light into the light-receiving device 110 from the light-emitting device 190 without via an object. Hence, a sensor with less noise and high sensitivity can be obtained. Providing the resin layer 159 allows the distance from the light-blocking layer 158 to the light-emitting device 190 to be shorter than the distance from the light-blocking layer 158 to the light-receiving device 110. Accordingly, viewing angle dependence of display can be reduced while noise of the sensor is reduced. Thus, both the display quality and imaging quality can be increased.

The structures of the partition 217 and the light-blocking layer 219a in the display apparatus 100A are similar to those in the display apparatus 10Q (FIG. 12A).

The partition 217 covers an end portion of the pixel electrode 181 and an end portion of the pixel electrode 191. The light-blocking layer 219a is provided over the partition 217. The light-blocking layer 219a is positioned between the light-receiving device 110 and the light-emitting device 190. The partition 217 and the light-blocking layer 219a preferably absorb the wavelength of light that the light-receiving device 110 senses. This can reduce stray light entering the light-receiving device 110.

The transistor 201, the transistor 205, and the transistor 206 are formed over the substrate 151. These transistors can be fabricated using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors, in which case the insulating layer can function as a barrier layer. Such a structure can effectively inhibit diffusion of impurities into the transistors from the outside and increase the reliability of the display apparatus.

An inorganic insulating film is preferably used as each of the insulating layers 211, 213, and 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating film often has a lower barrier property than an inorganic insulating film. Therefore, the organic insulating film preferably has an opening in the vicinity of an end portion of the display apparatus 100A. This can inhibit entry of impurities from the end portion of the display apparatus 100A through the organic insulating film. Alternatively, the organic insulating film may be formed so that its end portion is positioned on the inner side compared to the end portion of the display apparatus 100A, to prevent the organic insulating film from being exposed at the end portion of the display apparatus 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 14, an opening is formed in the insulating layer 214. This can inhibit entry of impurities into the display portion 162 from the outside through the insulating layer 214 even when an organic insulating film is used as the insulating layer 214. Consequently, the reliability of the display apparatus 100A can be increased.

Each of the transistor 201, the transistor 205, and the transistor 206 includes a conductive layer 221 functioning as a gate, the insulating layer 211 functioning as a gate insulating layer, a conductive layer 222a and the conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are illustrated with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The transistor 201, the transistor 205, and the transistor 206 employ a structure in which the semiconductor layer where a channel is formed is sandwiched between two gates. The two gates may be connected to each other and supplied with the same signal to operate the transistor. Alternatively, the threshold voltage of the transistor may be controlled by supplying a potential for controlling the threshold voltage to one of the two gates and a potential for driving to the other.

There is no particular limitation on the crystallinity of a semiconductor material used in the transistor, and an amorphous semiconductor or a semiconductor having crystallinity (a microcrystalline semiconductor, a polycrystalline semiconductor, a single crystal semiconductor, or a semiconductor partly including crystal regions) can be used. It is preferable to use a semiconductor having crystallinity, in which case degradation of the transistor characteristics can be suppressed.

The semiconductor layer of the transistor preferably contains a metal oxide (also referred to as an oxide semiconductor). Alternatively, the semiconductor layer of the transistor may contain silicon. Examples of silicon include amorphous silicon and crystalline silicon (e.g., low-temperature polysilicon and single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that the neighborhood of the atomic ratio includes ±30% of an intended atomic ratio.

For example, in the case of describing an atomic ratio of In:Ga:Zn=4:2:3 or a composition in the neighborhood thereof, the case is included in which with the atomic ratio of In being 4, the atomic ratio of Ga is greater than or equal to 1 and less than or equal to 3 and the atomic ratio of Zn is greater than or equal to 2 and less than or equal to 4. In the case of describing an atomic ratio of In:Ga:Zn=5:1:6 or a composition in the neighborhood thereof, the case is included in which with the atomic ratio of In being 5, the atomic ratio of Ga is greater than 0.1 and less than or equal to 2 and the atomic ratio of Zn is greater than or equal to 5 and less than or equal to 7. In the case of describing an atomic ratio of In:Ga:Zn=1:1:1 or a composition in the neighborhood thereof, the case is included in which with the atomic ratio of In being 1, the atomic ratio of Ga is greater than 0.1 and less than or equal to 2 and the atomic ratio of Zn is greater than 0.1 and less than or equal to 2.

The transistor included in the circuit 164 and the transistor included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

A connection portion 204 is provided in a region of the substrate 151 where the substrate 152 does not overlap. In the connection portion 204, the wiring 165 is electrically connected to the FPC 172 through a conductive layer 166 and a connection layer 242. On the top surface of the connection portion 204, the conductive layer 166 obtained by processing the same conductive film as the pixel electrode 181 is exposed. Thus, the connection portion 204 and the FPC 172 can be electrically connected to each other through the connection layer 242.

A variety of optical members can be arranged on the outside of the substrate 152. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film that is stain-resistant, a hard coat film resistant to generation of a scratch caused by the use, an impact-absorbing layer, or the like may be arranged on the outside of the substrate 152.

For each of the substrate 151 and the substrate 152, glass, quartz, ceramic, sapphire, a resin, or the like can be used. When a flexible material is used for the substrate 151 and the substrate 152, the flexibility of the display apparatus can be increased.

As the adhesive layer, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

The light-emitting device 190 can have a top-emission structure, a bottom-emission structure, a dual-emission structure, or the like. A conductive film that can transmit visible light is used as the electrode through which light is extracted. A conductive film that can reflect visible light is preferably used as the electrode through which light is not extracted.

The light-emitting device 190 includes at least the light-emitting layer 193. In addition to the light-emitting layer 193, the light-emitting device 190 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like. For example, the common layer 112 preferably includes one or both of a hole-injection layer and a hole-transport layer. For example, the common layer 114 preferably includes one or both of an electron-transport layer and an electron-injection layer.

The hole-injection layer injects holes from an anode to the hole-transport layer and contains a material with a high hole-injection property. As the material with a high hole-injection property, an aromatic amine compound and a composite material containing a hole-transport material and an acceptor material (electron-accepting material) can be used.

In the light-emitting device, the hole-transport layer transports holes that are injected from the anode by the hole-injection layer, to the light-emitting layer. In the light-receiving device, the hole-transport layer transports holes that are generated in the active layer on the basis of incident light, to the anode. The hole-transport layer contains a hole-transport material. The hole-transport material preferably has a hole mobility of $1\times10^{-6}$ cm$^2$/Vs or higher. Note that any other substance can also be used as long as the substance has a hole-transport property higher than an electron-transport property. As the hole-transport material, materials having a high hole-transport property, such as a t-electron rich heteroaromatic compound (e.g., a carbazole derivative, a thiophene derivative, and a furan derivative) and an aromatic amine (a compound having an aromatic amine skeleton), are preferable.

In the light-emitting device, the electron-transport layer transports electrons that are injected from the cathode by the electron-injection layer, to the light-emitting layer. In the light-receiving device, the electron-transport layer transports electrons that are generated in the active layer on the basis of incident light, to the cathode. The electron-transport layer contains an electron-transport material. The electron-transport material preferably has an electron mobility of $1\times10^{-6}$ cm$^2$/Vs or higher. Note that any other substance can also be used as long as the substance has an electron-transport property higher than a hole-transport property. As the electron-transport material, any of the following materials having a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

Either a low molecular compound or a high molecular compound can be used for the common layer 112, the light-emitting layer 193, and the common layer 114, and an inorganic compound may also be contained. The layers included in the common layer 112, the light-emitting layer 193, and the common layer 114 can be formed by an evaporation method (including a vacuum evaporation method), a transfer method, a printing method, an inkjet method, or a coating method, for example.

The light-emitting layer 193 contains a light-emitting substance. The light-emitting layer 193 can contain one or more kinds of light-emitting substances. As the light-emitting substance, a substance whose emission color is blue, violet, bluish violet, green, yellowish green, yellow, orange, red, or the like is appropriately used. Alternatively, a substance that emits near-infrared light can be used as the light-emitting substance.

The active layer 183 of the light-receiving device 110 contains a semiconductor. Examples of the semiconductor include an inorganic semiconductor such as silicon and an organic semiconductor including an organic compound. This embodiment shows an example in which an organic semiconductor is used as the semiconductor included in the active layer. The use of an organic semiconductor is preferable because the light-emitting layer 193 of the light-emitting device 190 and the active layer 183 of the light-receiving device 110 can be formed by the same method (e.g., a vacuum evaporation method) and thus the same manufacturing apparatus can be used.

Examples of an n-type semiconductor material included in the active layer 183 are electron-accepting organic semiconductor materials such as fullerene (e.g., $C_{60}$ and $C_{70}$) and derivatives thereof. Examples of a p-type semiconductor material included in the active layer 183 are electron-donating organic semiconductor materials such as copper(II) phthalocyanine (CuPc), tetraphenyldibenzoperiflanthene (DBP), and zinc phthalocyanine (ZnPc). As a p-type semiconductor material, tin phthalocyanine (SnPc) may be used.

For example, the active layer 183 is preferably formed by co-evaporation of an n-type semiconductor and a p-type semiconductor.

As materials for gates, a source, and a drain of a transistor and conductive layers functioning as wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; an alloy material containing any of these metal materials; or a nitride of the metal material (e.g., titanium nitride). In the case of using the metal material or the alloy material (or the nitride thereof), the thickness is preferably set small enough to be able to transmit light. Alternatively, a stacked film of any of the above materials can be used as the conductive layers. For example, a stacked film of indium tin oxide and an alloy of silver and magnesium is preferably used, in which case the conductivity can be increased. The above materials can also be used for conductive layers functioning as wirings and electrodes included in the display apparatus and the conductive layers of the display device (the conductive layers functioning as the pixel electrode and the common electrode).

Examples of insulating materials that can be used for the insulating layers include a resin such as an acrylic resin and an epoxy resin, and an inorganic insulating material such as silicon oxide, silicon oxynitride, silicon nitride oxide, silicon nitride, and aluminum oxide.

[Display Apparatus 100B]

FIG. 15A is a cross-sectional view of a display apparatus 100B.

The display apparatus 100B differs from the display apparatus 100A mainly in that the display apparatus 100B includes the protective layer 116 and has a solid sealing structure.

Providing the protective layer 116 that covers the light-receiving device 110 and the light-emitting device 190 can inhibit entry of impurities such as water into the light-receiving device 110 and the light-emitting device 190, thereby increasing the reliability of the light-receiving device 110 and the light-emitting device 190.

In the region 228 in the vicinity of an end portion of the display apparatus 100B, the insulating layer 215 and the protective layer 116 are preferably in contact with each other through an opening in the insulating layer 214. In particular, the inorganic insulating film included in the insulating layer 215 and the inorganic insulating film included in the protective layer 116 are preferably in contact with each other. Thus, entry of impurities from the outside into the display portion 162 through the organic insulating film can be inhibited. Accordingly, the reliability of the display apparatus 100B can be increased.

FIG. 15B illustrates an example in which the protective layer 116 has a three-layer structure. In FIG. 15B, the protective layer 116 includes an inorganic insulating layer 116a over the common electrode 115, an organic insulating layer 116b over the inorganic insulating layer 116a, and an inorganic insulating layer 116c over the organic insulating layer 116b.

An end portion of the inorganic insulating layer 116a and an end portion of the inorganic insulating layer 116c extend beyond an end portion of the organic insulating layer 116b and are in contact with each other. The inorganic insulating layer 116a is in contact with the insulating layer 215 (inorganic insulating layer) through the opening in the insulating layer 214 (organic insulating layer). Accordingly, the light-receiving device 110 and the light-emitting device 190 can be surrounded by the insulating layer 215 and the protective layer 116, whereby the reliability of the light-receiving device 110 and the light-emitting device 190 can be increased.

As described above, the protective layer 116 may have a stacked-layer structure of an organic insulating film and an inorganic insulating film. In that case, an end portion of the inorganic insulating film preferably extends beyond an end portion of the organic insulating film.

In the display apparatus 100B, the protective layer 116 and the substrate 152 are attached to each other with the adhesive layer 142. The adhesive layer 142 is provided to overlap with the light-receiving device 110 and the light-emitting device 190; that is, the display apparatus 100B employs a solid sealing structure.

[Display Apparatus 100C]

Figure 16:
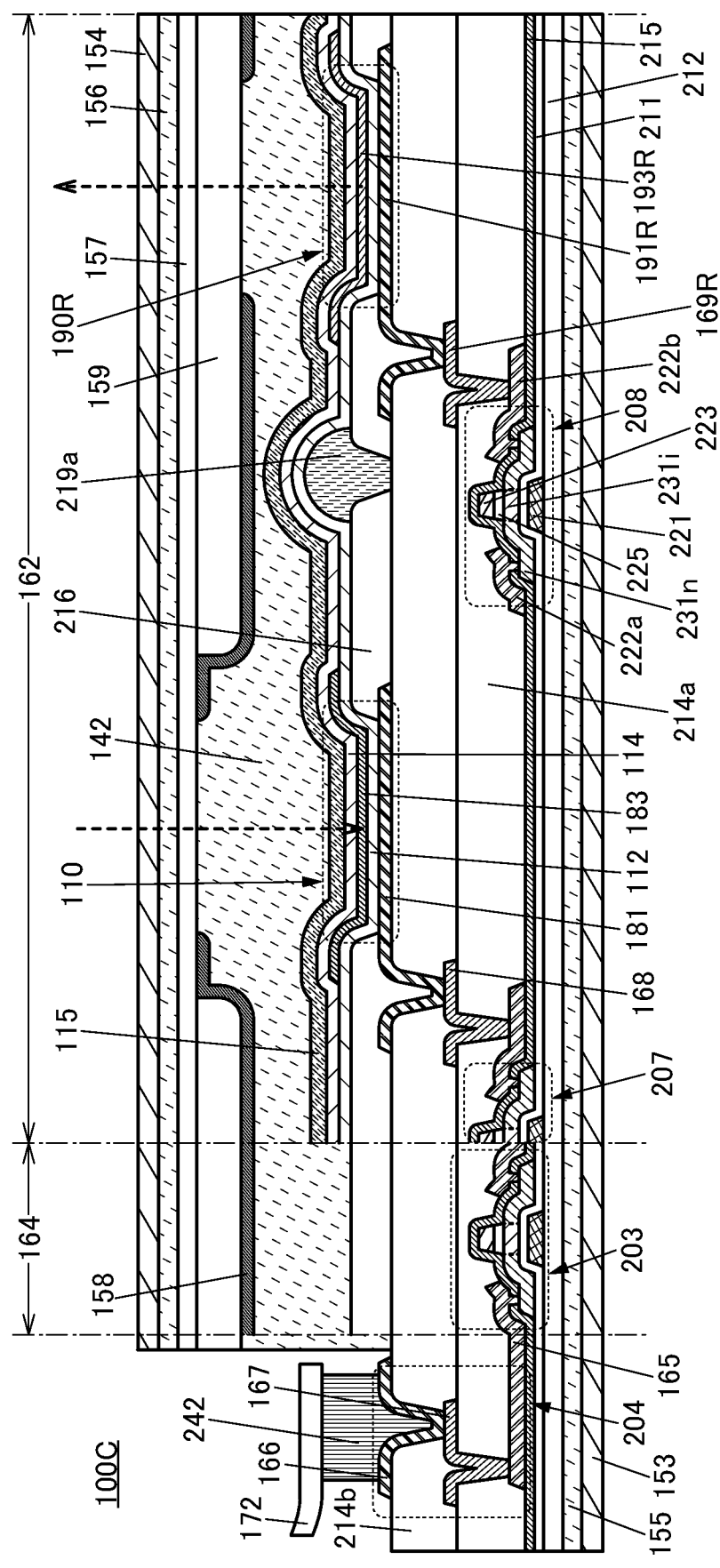
FIG. 16 is a cross-sectional view illustrating an example of a display apparatus.

FIG. 16 and FIG. 17A are cross-sectional views of a display apparatus 100C. A perspective view of the display apparatus 100C is similar to that of the display apparatus 100A (FIG. 13). FIG. 16 illustrates an example of cross sections of part of a region including the FPC 172, part of the circuit 164, and part of the display portion 162 in the display apparatus 100C. FIG. 17A illustrates an example of a cross section of part of the display portion 162 in the display apparatus 100C. FIG. 16 specifically illustrates an example of a cross section of a region including the light-receiving device 110 and the light-emitting device 190R emitting red light in the display portion 162. FIG. 17A specifically illustrates an example of a cross section of a region including the light-emitting device 190G emitting green light and the light-emitting device 190B emitting blue light in the display portion 162.

The display apparatus 100C illustrated in FIG. 16 and FIG. 17A includes a transistor 203, a transistor 207, a transistor 208, a transistor 209, a transistor 210, the light-emitting device 190R, the light-emitting device 190G, the light-emitting device 190B, the light-receiving device 110, and the like between the substrate 153 and the substrate 154.

The resin layer 159 and the common electrode 115 adhere to each other with the adhesive layer 142 provided therebetween, and the display apparatus 100C employs a solid sealing structure.

The substrate 153 and the insulating layer 212 are attached to each other with the adhesive layer 155. The substrate 154 and an insulating layer 157 are attached to each other with an adhesive layer 156.

To fabricate the display apparatus 100C, first, a first formation substrate provided with the insulating layer 212, the transistors, the light-receiving device 110, the light-emitting devices, and the like and a second formation substrate provided with the insulating layer 157, the resin layer 159, the light-blocking layer 158, and the like are attached to each other with the adhesive layer 142. Then, the substrate 153 is attached to a surface exposed by separation of the first formation substrate, and the substrate 154 is attached to a surface exposed by separation of the second formation substrate, whereby the components formed over the first formation substrate and the second formation substrate are transferred to the substrate 153 and the substrate 154. The substrate 153 and the substrate 154 are preferably flexible. Accordingly, the display apparatus 100C can be highly flexible.

The inorganic insulating film that can be used as the insulating layer 211, the insulating layer 213, and the insulating layer 215 can be used as the insulating layer 212 and the insulating layer 157.

The light-emitting device 190R has a stacked-layer structure in which the pixel electrode 191R, the common layer 112, the light-emitting layer 193R, the common layer 114, and the common electrode 115 are stacked in this order from an insulating layer 214b side. The pixel electrode 191R is connected to a conductive layer 169R through an opening provided in the insulating layer 214b. The conductive layer 169R is connected to the conductive layer 222b included in the transistor 208 through an opening provided in an insulating layer 214a. The conductive layer 222b is connected to a low-resistance region 231n through an opening provided in the insulating layer 215. That is, the pixel electrode 191R is electrically connected to the transistor 208. The transistor 208 has a function of controlling the driving of the light-emitting device 190R.

Similarly, the light-emitting device 190G has a stacked-layer structure in which the pixel electrode 191G, the common layer 112, the light-emitting layer 193G, the common layer 114, and the common electrode 115 are stacked in this order from the insulating layer 214b side. The pixel electrode 191G is electrically connected to the low-resistance region 231n of the transistor 209 through a conductive layer 169G and the conductive layer 222b of the transistor 209. That is, the pixel electrode 191G is electrically connected to the transistor 209. The transistor 209 has a function of controlling the driving of the light-emitting device 190G.

The light-emitting device 190B has a stacked-layer structure in which the pixel electrode 191B, the common layer 112, the light-emitting layer 193B, the common layer 114, and the common electrode 115 are stacked in this order from the insulating layer 214b side. The pixel electrode 191B is electrically connected to the low-resistance region 231n of the transistor 210 through a conductive layer 169B and the conductive layer 222b of the transistor 210. That is, the pixel electrode 191B is electrically connected to the transistor 210. The transistor 210 has a function of controlling the driving of the light-emitting device 190B.

The light-receiving device 110 has a stacked-layer structure in which the pixel electrode 181, the common layer 112, the active layer 183, the common layer 114, and the common electrode 115 are stacked in this order from the insulating layer 214b side. The pixel electrode 181 is electrically connected to the low-resistance region 231n of the transistor 207 through a conductive layer 168 and the conductive layer 222b of the transistor 207. That is, the pixel electrode 181 is electrically connected to the transistor 207.

End portions of the pixel electrodes 181, 191R, 191G, and 191B are covered with the partition 216. The pixel electrodes 181, 191R, 191G, and 191B contain a material that reflects visible light, and the common electrode 115 contains a material that transmits visible light.

Light from the light-emitting devices 190R, 190G, and 190B is emitted toward the substrate 154. Light enters the light-receiving device 110 through the substrate 154 and the adhesive layer 142. For the substrate 154, a material having a high visible-light-transmitting property is preferably used.

The pixel electrode 181 and the pixel electrode 191 can be formed using the same material in the same step. The common layer 112, the common layer 114, and the common electrode 115 are shared by the light-receiving device 110 and the light-emitting devices 190R, 190G, and 190B. The light-receiving device 110 and the light-emitting devices of respective colors can have common components except the active layer 183 and the light-emitting layer. Thus, the light-receiving device 110 can be incorporated into the display apparatus 100C without a significant increase in the number of manufacturing steps.

The resin layer 159 and the light-blocking layer 158 are provided on a surface of the insulating layer 157 on the substrate 153 side. The resin layer 159 is provided at the positions overlapping with the light-emitting devices 190R, 190G, and 190B and is not provided at the position overlapping with the light-receiving device 110. The light-blocking layer 158 is provided to cover the surface of the insulating layer 157 on the substrate 153 side, a side surface of the resin layer 159, and a surface of the resin layer 159 on the substrate 153 side. The light-blocking layer 158 has openings at the position overlapping with the light-receiving device 110 and at the positions overlapping with the light-emitting devices 190R, 190G, and 190B. Providing the light-blocking layer 158 can control the range where the light-receiving device 110 senses light. Moreover, providing the light-blocking layer 158 can inhibit direct entry of light into the light-receiving device 110 from the light-emitting devices 190R, 190G, and 190B without via an object. Hence, a sensor with less noise and high sensitivity can be obtained. Since the resin layer 159 is provided, the distance from the light-blocking layer 158 to the light-emitting device of each color is shorter than the distance from the light-blocking layer 158 to the light-receiving device 110. Accordingly, viewing angle dependence of display can be reduced while noise of the sensor is reduced. Thus, both the display quality and imaging quality can be increased.

The structures of the partition 216, the light-blocking layer 219a, and the spacer 219b in the display apparatus 100C are the same as those in the display apparatus 10K (see FIG. 7B and FIG. 8A).

In FIG. 16, the partition 216 has an opening between the light-receiving device 110 and the light-emitting device 190R. The light-blocking layer 219a is provided so as to fill the opening. The light-blocking layer 219a is positioned between the light-receiving device 110 and the light-emitting device 190R. The light-blocking layer 219a absorbs light emitted from the light-emitting device 190R. Thus, stray light entering the light-receiving device 110 can be reduced.

The spacer 219b is positioned between the light-emitting device 190G and the light-emitting device 190B. The top surface of the spacer 219b is preferably closer to the light-blocking layer 158 than the top surface of the light-blocking layer 219a is. For example, the sum of the height (thickness) of the partition 216 and the height (thickness) the spacer 219b is preferably larger than the height (thickness) of the light-blocking layer 219a. This allows easy filling with the adhesive layer 142. As illustrated in FIG. 17A, the light-blocking layer 158 may be in contact with the common electrode 115 (or the protective layer) in a portion where the spacer 219b and the light-blocking layer 158 overlap with each other.

The connection portion 204 is provided in a region of the substrate 153 where the substrate 154 does not overlap. In the connection portion 204, the wiring 165 is electrically connected to the FPC 172 through a conductive layer 167, the conductive layer 166, and the connection layer 242. The conductive layer 167 can be obtained by processing the same conductive film as the conductive layer 168. On the top surface of the connection portion 204, the conductive layer 166 obtained by processing the same conductive film as the pixel electrode 181 is exposed. Thus, the connection portion 204 and the FPC 172 can be electrically connected to each other through the connection layer 242.

Each of the transistor 207, the transistor 208, the transistor 209, and the transistor 210 includes the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the low-resistance regions 231n through openings provided in the insulating layer 215. One of the conductive layer 222a and the conductive layer 222b serves as a source, and the other serves as a drain.

In FIG. 16, the insulating layer 225 overlaps with the channel formation region 231i of the semiconductor layer 231 and does not overlap with the low-resistance regions 231n. The structure illustrated in FIG. 16 can be formed by processing the insulating layer 225 using the conductive layer 223 as a mask, for example. In FIG. 16, the insulating layer 215 is provided to cover the insulating layer 225 and the conductive layer 223, and the conductive layer 222a and the conductive layer 222b are connected to the low-resistance regions 231n through the openings in the insulating layer 215. Furthermore, an insulating layer that covers the transistor may be provided over the conductive layer 222a and the conductive layer 222b.

FIG. 17B illustrates an example in which the insulating layer 225 covers a top surface and a side surface of the semiconductor layer. The conductive layer 222a and the conductive layer 222b are connected to the low-resistance regions 231n through openings provided in the insulating layer 225 and the insulating layer 215.

As described above, the display apparatus of this embodiment includes a light-receiving device and a light-emitting device in a display portion, and the display portion has both a function of displaying an image and a function of sensing light. Thus, the size and weight of an electronic device can be reduced as compared to the case where a sensor is provided outside a display portion or outside a display apparatus. Moreover, an electronic device having more functions can be obtained in a combination with a sensor provided outside the display portion or outside the display apparatus.

In the light-receiving device, at least one of the layers provided between a pair of electrodes can be shared with the light-emitting device (EL device). For example, all the layers in the light-receiving device except the active layer can have structures in common with the layers in the light-emitting device (EL device). In other words, with only the addition of the step of forming the active layer to the manufacturing process of the light-emitting device, the light-emitting device and the light-receiving device can be formed over one substrate. The pixel electrodes and the common electrodes in the light-receiving device and the light-emitting device can be formed using the same material in the same step. When a circuit electrically connected to the light-receiving device and a circuit electrically connected to the light-emitting device are formed using the same material in the same process, the manufacturing process of the display apparatus can be simplified. In such a manner, a display apparatus that incorporates a light-receiving device and is highly convenient can be manufactured without complicated steps.

In the display apparatus of this embodiment, on a surface where the light-blocking layer is formed, a component is provided so that the distance from the light-blocking layer to the light-receiving device is long and the distance from the light-blocking layer to the light-emitting device is short. Accordingly, noise of the sensor can be reduced, the imaging resolution can be increased, and viewing angle dependence of display can be reduced. Thus, both the display quality and imaging quality of the display apparatus can be increased.

This embodiment can be combined with the other embodiments as appropriate. In this specification, in the case where a plurality of structure examples are shown in one embodiment, the structure examples can be combined as appropriate.

Embodiment 2

In this embodiment, the display apparatus of one embodiment of the present invention will be described with reference to FIG. 18 and FIG. 19.

[Configuration Example of Pixel Circuit]

A configuration example of a pixel circuit included in a display apparatus is now described with reference to FIG. 18.

In the display apparatus of one embodiment of the present invention, a display portion includes first pixel circuits including a light-receiving device and second pixel circuits including a light-emitting device. The first pixel circuits and the second pixel circuits are arranged in a matrix.

Figure 18A:
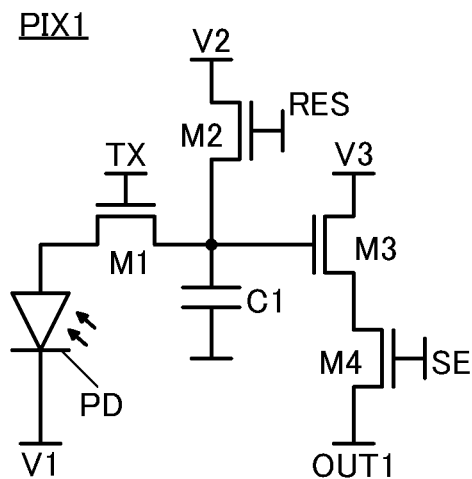
FIG. 18A and FIG. 18B are circuit diagrams each illustrating an example of a pixel circuit.
Figure 18B:
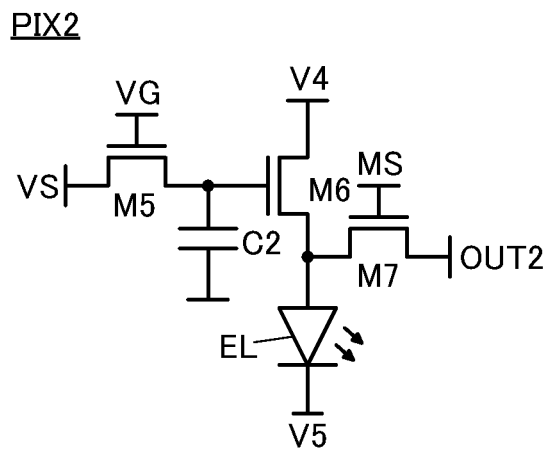

FIG. 18A illustrates an example of the first pixel circuit including a light-receiving device. FIG. 18B illustrates an example of the second pixel circuit including a light-emitting device.

The first pixel circuit PIX1 illustrated in FIG. 18A includes the light-receiving device PD, a transistor M1, a transistor M2, a transistor M3, a transistor M4, and a capacitor C1. Here, a photodiode is used as an example of the light-receiving device PD.

A cathode of the light-receiving device PD is electrically connected to a wiring V1, and an anode of the light-receiving device PD is electrically connected to one of a source and a drain of the transistor M1. A gate of the transistor M1 is electrically connected to a wiring TX, and the other of the source and the drain of the transistor M1 is electrically connected to one electrode of the capacitor C1, one of a source and a drain of the transistor M2, and a gate of the transistor M3. A gate of the transistor M2 is electrically connected to a wiring RES, and the other of the source and the drain of the transistor M2 is electrically connected to a wiring V2. One of a source and a drain of the transistor M3 is electrically connected to a wiring V3, and the other of the source and the drain of the transistor M3 is electrically connected to one of a source and a drain of the transistor M4. A gate of the transistor M4 is electrically connected to a wiring SE, and the other of the source and the drain of the transistor M4 is electrically connected to a wiring OUT1.

A constant potential is supplied to each of the wiring V1, the wiring V2, and the wiring V3. When the light-receiving device PD is driven with a reverse bias, the wiring V2 is supplied with a potential lower than the potential of the wiring V1. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node is changed, in accordance with electric charge generated in the light-receiving device PD. The transistor M3 functions as an amplifier transistor that performs an output corresponding to the potential of the node. The transistor M4 is controlled by a signal supplied to the wiring SE and functions as a selection transistor for reading an output corresponding to the potential of the node by an external circuit connected to the wiring OUT1.

The second pixel circuit PIX2 illustrated in FIG. 18B includes a light-emitting device EL, a transistor M5, a transistor M6, a transistor M7, and a capacitor C2. Here, a light-emitting diode is used as an example of the light-emitting device EL. In particular, an organic EL device is preferably used as the light-emitting device EL.

A gate of the transistor M5 is electrically connected to a wiring VG, one of a source and a drain of the transistor M5 is electrically connected to a wiring VS, and the other of the source and the drain of the transistor M5 is electrically connected to one electrode of the capacitor C2 and a gate of the transistor M6. One of a source and a drain of the transistor M6 is electrically connected to a wiring V4, and the other is electrically connected to an anode of the light-emitting device EL and one of a source and a drain of the transistor M7. A gate of the transistor M7 is electrically connected to a wiring MS, and the other of the source and the drain of the transistor M7 is electrically connected to a wiring OUT2. A cathode of the light-emitting device EL is electrically connected to a wiring V5.

A constant potential is supplied to each of the wiring V4 and the wiring V5. The anode of the light-emitting device EL can be set to a high potential, and the cathode can be set to a lower potential than the anode. The transistor M5 is controlled by a signal supplied to the wiring VG and functions as a selection transistor for controlling a selection state of the second pixel circuit PIX2. The transistor M6 functions as a driving transistor that controls a current flowing through the light-emitting device EL in accordance with a potential supplied to the gate of the transistor M6. When the transistor M5 is in an electrical conducting state, a potential supplied to the wiring VS is supplied to the gate of the transistor M6, and the luminance of the light-emitting device EL can be controlled in accordance with the potential. The transistor M7 is controlled by a signal supplied to the wiring MS and has a function of outputting a potential between the transistor M6 and the light-emitting device EL to the outside through the wiring OUT2.

The wiring V1, to which the cathode of the light-receiving device PD is electrically connected, and the wiring V5, to which the cathode of the light-emitting device EL is electrically connected, can be provided in the same layer and have the same potential.

Here, a transistor in which a metal oxide (an oxide semiconductor) is used as a semiconductor layer where a channel is formed is preferably used as each of the transistor M1, the transistor M2, the transistor M3, and the transistor M4 included in the first pixel circuit PIX1 and the transistor M5, the transistor M6, and the transistor M7 included in the second pixel circuit PIX2. This can reduce the power consumption of the display apparatus.

Alternatively, a transistor using silicon as a semiconductor layer in which a channel is formed is preferably used as each of the transistor M1 to the transistor M7. This enables high-speed driving of the circuits.

When one kind of transistor is used in a display apparatus, the number of steps for manufacturing the display apparatus can be reduced, leading to a high yield.

Alternatively, transistors including an oxide semiconductor may be used as one to six transistor(s) of the transistor M1 to the transistor M7, and a transistor(s) including silicon may be used as the other transistor(s). A case of using both a transistor using an oxide semiconductor and a transistor using low-temperature polysilicon is described below.

Here, as each of the transistor M1 and the transistor M2 included in the first pixel circuit PIX1, it is preferable to use a transistor using an oxide semiconductor as a semiconductor layer where a channel is formed.

The semiconductor layers included in the transistor M1 and the transistor M2 each preferably include indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is preferable to use, in particular, an oxide containing indium (In), gallium (Ga), and zinc (Zn) (also referred to as IGZO) for the semiconductor layer.

The description in Embodiment 1 can be referred to for the metal oxide that can be used for the semiconductor layer.

A transistor using an oxide semiconductor having a wider band gap and a lower carrier density than silicon can achieve an extremely low off-state current. Thus, such a low off-state current enables retention of electric charge accumulated in a capacitor that is connected in series with the transistor for a long time. Therefore, it is preferable to use transistors having an oxide semiconductor as especially the transistor M1 and the transistor M2 each of which is connected in series with the capacitor C1. By using the transistors including an oxide semiconductor as the transistor M1 and the transistor M2, a potential retained in the gate of the transistor M3 on the basis of electric charge generated in the light-receiving device PD can be prevented from leaking through the transistor M1 or the transistor M2.

For example, in the case where image capturing is performed using a global shutter system, a period from the end of electric charge accumulation operation to the start of reading operation (charge retention period) varies among pixels. For example, when an image with a uniform grayscale level is captured, output signals in all the pixels ideally have potentials of the same level. However, in the case where the length of the charge retention period varies row by row, if electric charge accumulated at nodes in the pixels in each row leaks out over time, the potential of an output signal in a pixel varies row by row, and image data varies in gray level row by row. Thus, when the transistors having oxide semiconductor are used as the transistor M1 and the transistor M2, such a potential change at the node can be extremely small. That is, even when image capturing is performed using the global shutter system, it is possible to minimize variation in grayscale of image data due to a difference in the length of the charge retention period, and it is possible to enhance the quality of captured images.

Meanwhile, it is preferable to use, as the transistor M3 included in the first pixel circuit PIX1, a transistor using low-temperature polysilicon as a semiconductor layer. The transistor using low-temperature polysilicon as a semiconductor layer can have a higher field-effect mobility than a transistor using an oxide semiconductor, and thus is superior in driving capability and current capability. Thus, the transistor M3 can operate at higher speed than the transistors M1 and M2. By using low-temperature polysilicon in the semiconductor layer of the transistor M3, an output in accordance with the extremely low potential based on the amount of light received by the light-receiving device PD can be quickly supplied to the transistor M4.

In other words, since the transistors M1 and M2 have low leakage current and the transistor M3 has high driving capability, high-speed reading can be performed without a leakage of an extremely low potential read from the light-receiving device PD in the first pixel circuit PIX1.

The transistor M4 included in the first pixel circuit PIX1 functions as a switch for supplying the output from the transistor M3 to the wiring OUT1 and thus does not have a function such as low off-state current or high-speed operation, which is desired for the transistor M1 to the transistor M3. For this reason, either low-temperature polysilicon or an oxide semiconductor may be used for the semiconductor layer of the transistor M4.

In the second pixel circuit PIX2 in FIG. 18B, transistors using low-temperature polysilicon as a semiconductor in which a channel is formed or transistors using an oxide semiconductor as a semiconductor in which a channel is formed can be used as the transistor M5 to the transistor M7. Alternatively, as in the first pixel circuit PIX1, a transistor using low-temperature polysilicon as a semiconductor layer and a transistor using an oxide semiconductor as a semiconductor layer may be used in combination.

Thus, it is preferable to use a transistor using an oxide semiconductor especially as the transistor M5 which is connected in series with the capacitor C2.

Although n-channel transistors are illustrated as the transistors in FIG. 18A and FIG. 18B, p-channel transistors can be used. The transistors are not limited to single-gate transistors and may further include a back gate.

The transistors included in the first pixel circuit PIX1 and the transistors included in the second pixel circuit PIX2 are preferably formed side by side over the same substrate. In particular, it is preferable that the transistors included in the first pixel circuit PIX1 and the transistors included in the second pixel circuit PIX2 coexist and be periodically arranged in one region.

One or more layers including one or both of the transistor and the capacitor are preferably provided at a position overlapping with the light-receiving device PD or the light-emitting device EL. Thus, the effective occupied area of each pixel circuit can be reduced, and a high-resolution light-receiving portion or display portion can be achieved.

[Configuration Example of Display Apparatus]

Next, a configuration example of the display apparatus will be described with reference to FIG. 19.

Figure 19A:
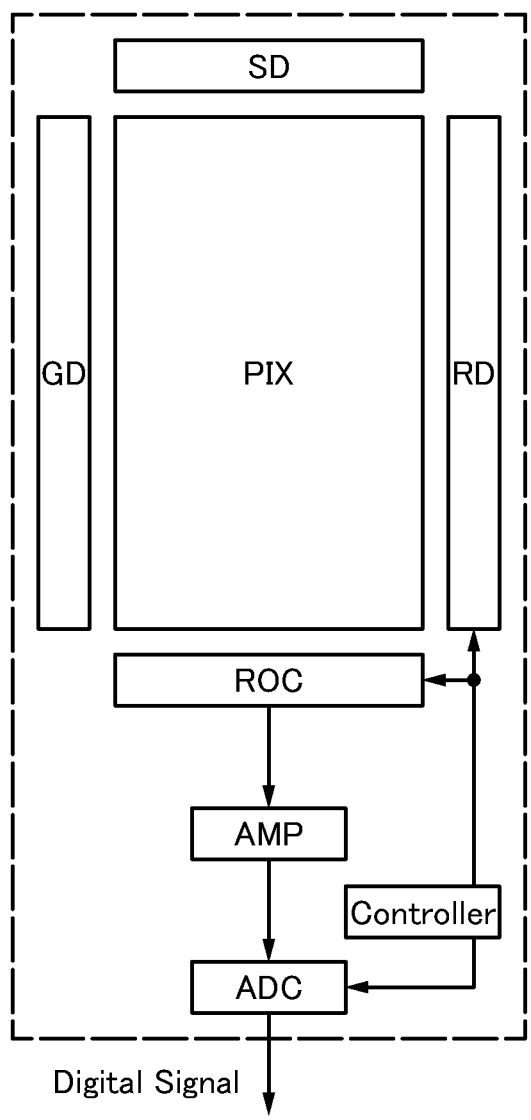
FIG. 19A and FIG. 19B are a top view each illustrating an example of a display apparatus.

The display portion described in Embodiment 1 can be used as a display portion PIX in FIG. 19A. Pixels are arranged in matrix in the display portion PIX, and the first pixel circuits PIX1 in FIG. 18A and the second pixel circuits PIX2 in FIG. 18B are arranged in matrix. A gate driver GD and a source driver SD are electrically connected to the second pixel circuit PIX2 in FIG. 18B and supply signals to the second pixel circuit PIX2. A row-selection driver RD and a read-out circuit ROC are electrically connected to the first pixel circuit PIX1 in FIG. 18A and supply signals to the first pixel circuit PIX1. The row-selection driver RD is electrically connected to the wiring SE and the wiring RES in the first pixel circuit PIX1 in FIG. 18A. The read-out circuit ROC is electrically connected to the wiring OUT1.

The row-selection driver RD and the read-out circuit ROC are controlled by a controller (Controller). In addition, an analog-digital converter circuit ADC described later is controlled by the same controller.

The display portion PIX in FIG. 19A includes a transistor using low-temperature polysilicon as a semiconductor layer and a transistor using a metal oxide as a semiconductor layer.

On the other hand, the circuits provided around the display portion PIX in FIG. 19A desirably have high-speed driving rather than low off-state current characteristics. Therefore, such circuits preferably include transistors using low-temperature polysilicon. In addition, when transistors using low-temperature polysilicon are used, both p-channel and n-channel transistors can be manufactured through a series of manufacturing processes, so that CMOS can be manufactured. Therefore, in particular, an amplifier circuit AMP electrically connected to the read-out circuit ROC, the analog-digital converter circuit ADC electrically connected to the amplifier circuit AMP, and the controller are each preferably configured with CMOS and thus are preferably formed with transistors using low-temperature polysilicon.

That is, the amplifier circuit AMP, the analog-digital converter circuit ADC, and the controller as well as the display portion PIX, the gate driver GD, the source driver SD, the row-selection driver RD, and the read-out circuit ROC all can be formed over the same substrate by a series of manufacturing processes. A digital signal (Digital Signal) is output from the analog-digital converter circuit ADC.

Figure 19B:
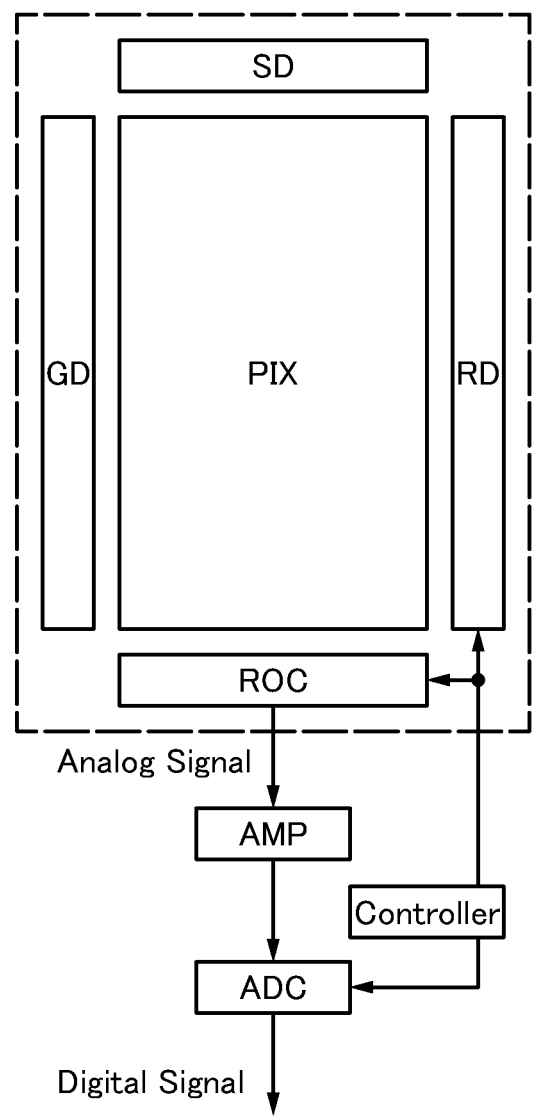

FIG. 19B illustrates an example of a panel in which the display portion PIX, the gate driver GD, the source driver SD, the row-selection driver RD, and the read-out circuit ROC are all formed with transistors each using a metal oxide for a channel. An analog signal (Analog Signal) is output from the read-out circuit ROC. In the case of the transistors each using a metal oxide is used for a channel, it is difficult to form an n-type transistor and a p-type transistor using the same semiconductor material, as compared to the case of transistors using silicon. In other words, it is more difficult to form CMOS with a transistor using a metal oxide, than a transistor using silicon. Therefore, in a preferred example, the amplifier circuit AMP, the analog-digital converter circuit ADC, and the controller that are preferably configured with CMOS are not provided on the same substrate as the display portion PIX, and the amplifier circuit AMP and the analog-digital converter circuit ADC are provided by connection of, for example, IC chips that are separately manufactured.

When all the peripheral circuits in the display portion PIX are formed using transistors using low-temperature polysilicon as in FIG. 19A, the panel can be provided at lower cost than that of the structure in FIG. 19B. The component cost and the mounting cost can be reduced as compared to those of the case in FIG. 19B in which the amplifier circuit AMP, the analog-digital converter circuit ADC, and the controller are prepared using external IC chips.

As described above, the display apparatus of one embodiment of the present invention includes the transistor using low-temperature polysilicon as a semiconductor layer. Accordingly, the variety of circuits including CMOS circuits can be easily formed on the same substrate as the display portion. Thus, external circuits mounted on the display apparatus can be simplified, and the component cost and the mounting cost can be reduced. Alternatively, the display apparatus of one embodiment of the present invention includes a transistor using an oxide semiconductor as a semiconductor layer. Thus, the power consumption of the display apparatus can be reduced.

Alternatively, the display apparatus of one embodiment of the present invention includes two kinds of transistors: a transistor using an oxide semiconductor as a semiconductor layer and a transistor using low-temperature polysilicon as a semiconductor layer. Thus, the material for the semiconductor layer can be changed depending on the function required for the transistors. In addition, since transistors using LTPS as a semiconductor layer are included, various circuits configured with CMOS circuits can be easily formed on the same substrate as the display portion. Thus, external circuits mounted on the display apparatus can be simplified, and the component costs and the mounting cost can be reduced.

This embodiment can be combined with the other embodiments as appropriate.

Embodiment 3

In this embodiment, electronic devices of embodiments of the present invention will be described with reference to FIG. 20 to FIG. 22.

An electronic device of this embodiment includes the display apparatus of one embodiment of the present invention. For example, the display apparatus of one embodiment of the present invention can be used in a display portion of the electronic device. The display apparatus of one embodiment of the present invention has a function of detecting light, and is thus capable of performing biological authentication with the display portion or detecting touch or near-touch on the display portion. Thus, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device of this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 20A:
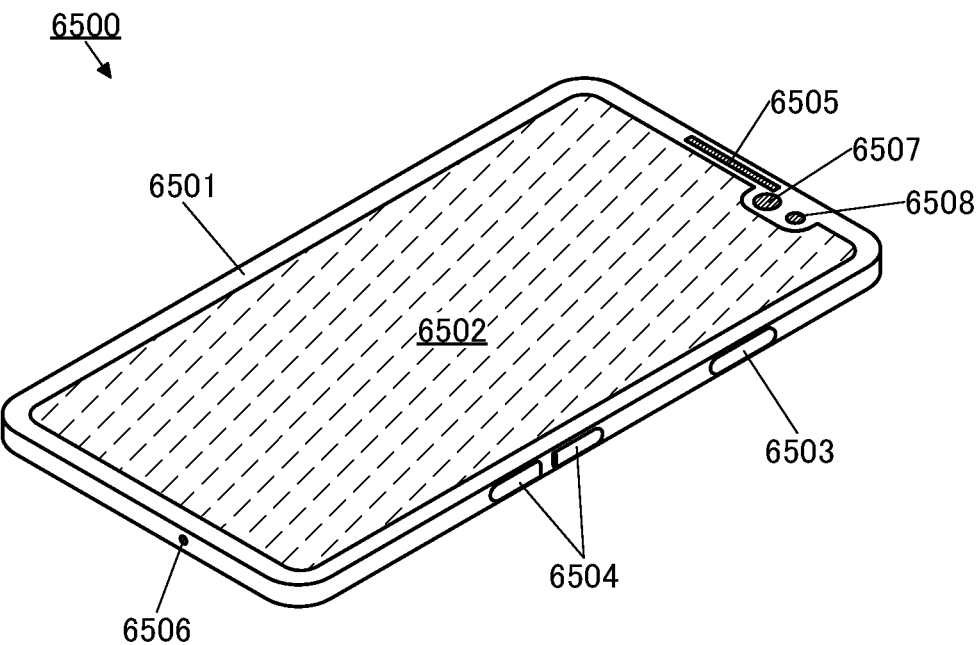
FIG. 20A and FIG. 20B are diagrams illustrating an example of an electronic device.

An electronic device 6500 illustrated in FIG. 20A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 20B:
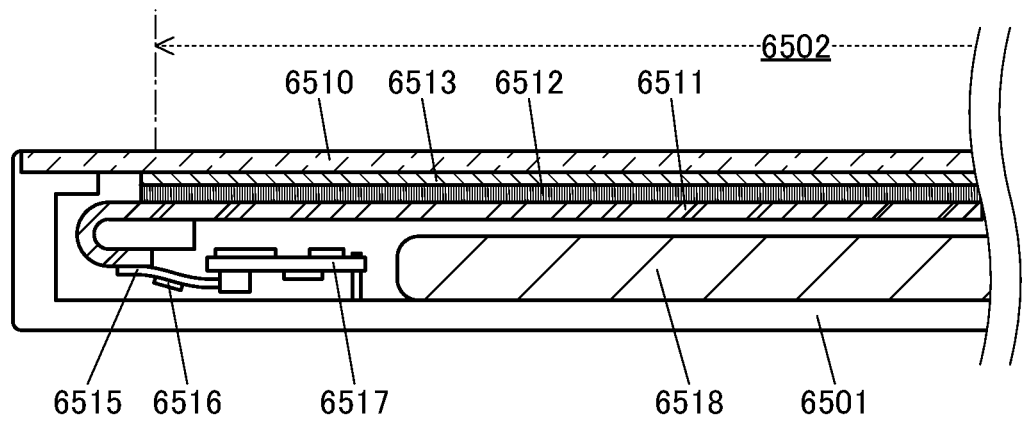

FIG. 20B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be provided. Since the display panel 6511 is extremely thin, the battery 6518 with high capacity can be mounted while the thickness of the electronic device is suppressed. An electronic device with a narrow bezel can be obtained when part of the display panel 6511 is folded back so that the portion connected to the FPC 6515 is positioned on the rear side of a pixel portion.

Figure 21A:
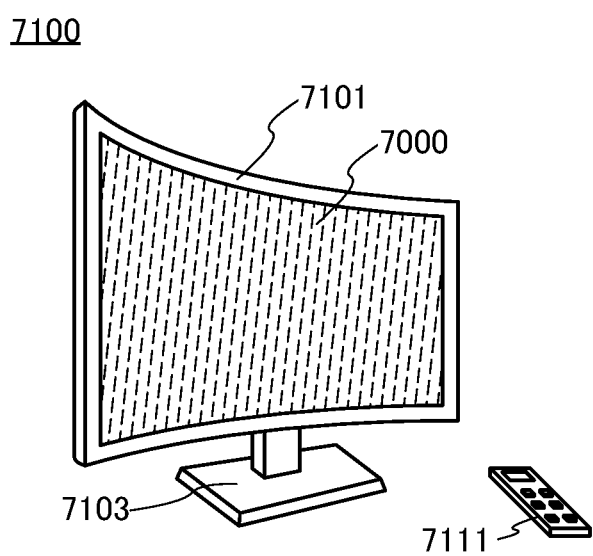
FIG. 21A to FIG. 21D are diagrams illustrating examples of electronic devices.

FIG. 21A illustrates an example of a television device. In a television device 7100, a display portion 7000 is incorporated in a housing 7101. Here, a structure in which the housing 7101 is supported by a stand 7103 is illustrated.

The display apparatus of one embodiment of the present invention can be used in the display portion 7000.

Operation of the television device 7100 illustrated in FIG. 21A can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be controlled.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 21B:
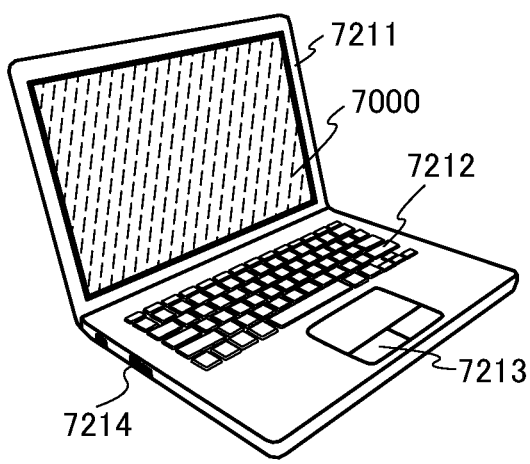

FIG. 21B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used in the display portion 7000.

Figure 21C:
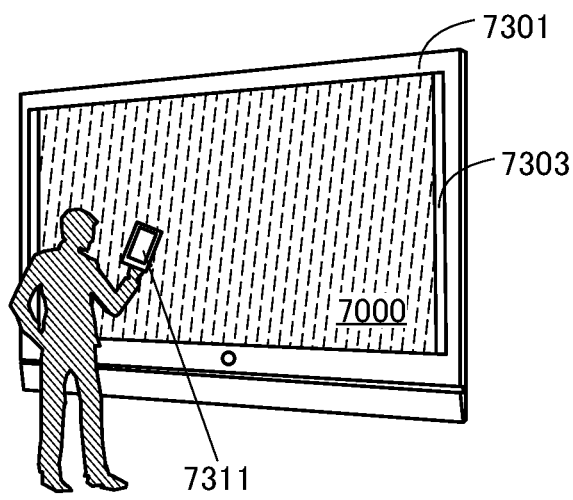
Figure 21D:
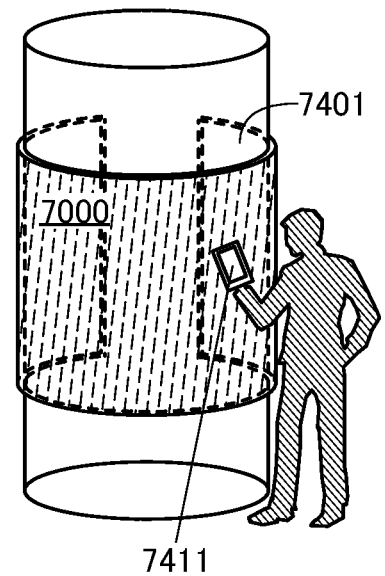

FIG. 21C and FIG. 21D illustrate examples of digital signage.

Digital signage 7300 illustrated in FIG. 21C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 21D is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 in FIG. 21C and FIG. 21D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 21C and FIG. 21D, it is preferable that the digital signage 7300 or the digital signage 7400 can work with an information terminal 7311 or an information terminal 7411 such as a smartphone of a user through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game at the same time.

Electronic devices illustrated in FIG. 22A to FIG. 22F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 22A to FIG. 22F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 22A to FIG. 22F are described below.

Figure 22A:
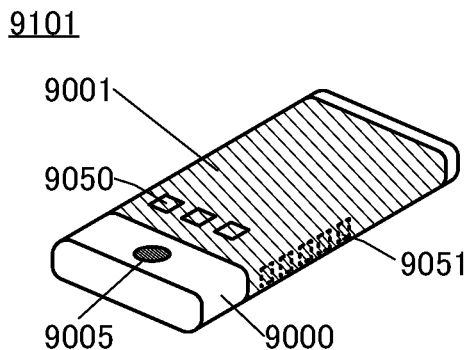
FIG. 22A to FIG. 22F are diagrams illustrating examples of electronic devices.

FIG. 22A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 22A illustrates an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 22B:
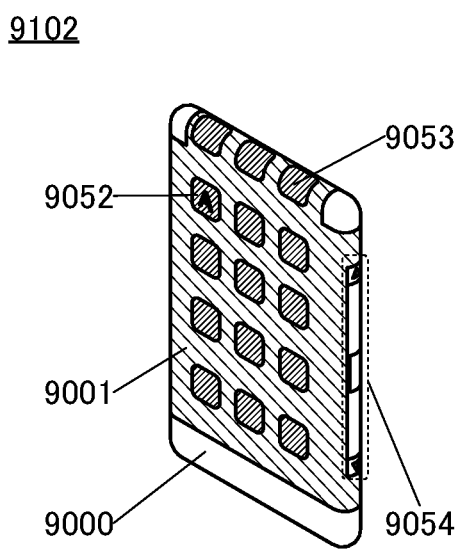

FIG. 22B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 22C:
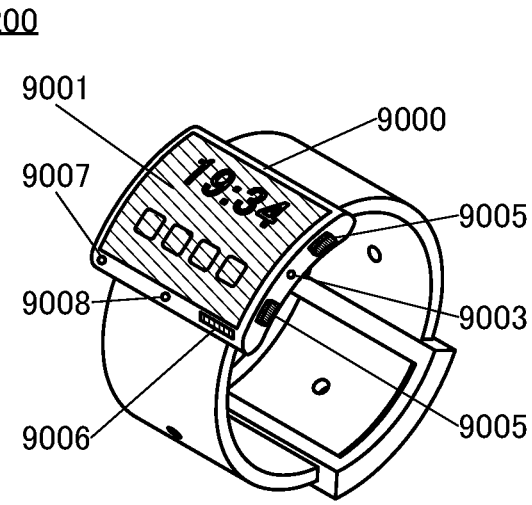

FIG. 22C is a perspective view illustrating a watch-type portable information terminal 9200. For example, the portable information terminal 9200 can be used as a smartwatch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal or charging. Note that the charging operation may be performed by wireless power feeding.

Figure 22D:
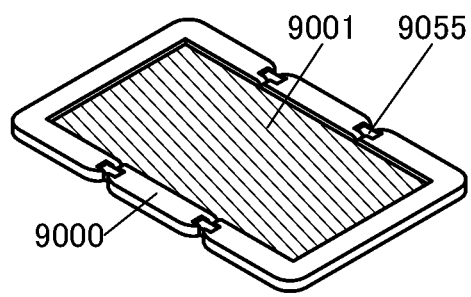
Figure 22E:
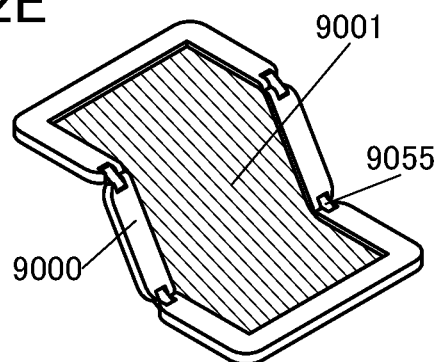
Figure 22F:
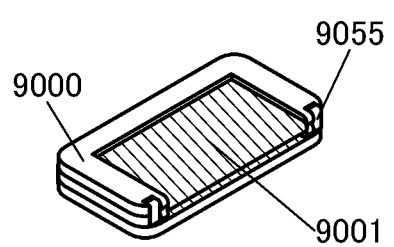

FIG. 22D to FIG. 22F are perspective views illustrating a foldable portable information terminal 9201. FIG. 22D is a perspective view of an opened state of the portable information terminal 9201, FIG. 22F is a perspective view of a folded state thereof, and FIG. 22E is a perspective view of a state in the middle of change from one of FIG. 22D and FIG. 22F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature greater than or equal to 0.1 mm and less than or equal to 150 mm.

This embodiment can be combined with the other embodiments as appropriate.

REFERENCE NUMERALS

C1: capacitor, C2: capacitor, L1: shortest distance, L2: shortest distance, L3: thickness, L4: total, M1: transistor, M2: transistor, M3: transistor, M4: transistor, M5: transistor, M6: transistor, M7: transistor, OUT1: wiring, OUT2: wiring, PIX1: pixel circuit, PIX2: pixel circuit, V1: wiring, V2: wiring, V3: wiring, V4: wiring, V5: wiring, 10: display apparatus, 10A: display apparatus, 10B: display apparatus, 10C: display apparatus, 10D: display apparatus, 10E: display apparatus, 10F: display apparatus, 10G: display apparatus, 10H: display apparatus, 10J: display apparatus, 10K: display apparatus, 10L: display apparatus, 10M: display apparatus, 10N: display apparatus, 10P: display apparatus, 10Q: display apparatus, 21: emitted light, 21B: light, 21G: light, 21R: light, 22: light, 23: light, 23a: stray light, 23b: stray light, 23c: stray light, 23d: stray light, 24: reflected light, 41: transistor, 42: transistor, 42B: transistor, 42G: transistor, 42R: transistor, 50A: display apparatus, 50B: display apparatus, 51: substrate, 52: finger, 53: layer including light-receiving device, 55: layer including transistor, 57: layer including light-emitting device, 59: substrate, 100A: display apparatus, 100B: display apparatus, 100C: display apparatus, 110: light-receiving device, 112: common layer, 113: light-emitting layer, 114: common layer, 115: common electrode, 116: protective layer, 116a: inorganic insulating layer, 116b: organic insulating layer, 116c: inorganic insulating layer, 142: adhesive layer, 143: space, 146: lens array, 149: lens, 151: substrate, 152: substrate, 153: substrate, 154: substrate, 155: adhesive layer, 156: adhesive layer, 157: insulating layer, 158: light-blocking layer, 159: resin layer, 159p: opening, 160: space, 162: display portion, 164: circuit, 165: wiring, 166: conductive layer, 167: conductive layer, 168: conductive layer, 169B: conductive layer, 169G: conductive layer, 169R: conductive layer, 172: FPC, 173: IC, 181: pixel electrode, 182: buffer layer, 183: active layer, 184: buffer layer, 190: light-emitting device, 190B: light-emitting device, 190G: light-emitting device, 190R: light-emitting device, 191: pixel electrode, 191B: pixel electrode, 191G: pixel electrode, 191R: pixel electrode, 192: buffer layer, 193: light-emitting layer, 193B: light-emitting layer, 193G: light-emitting layer, 193R: light-emitting layer, 194: buffer layer, 197: optical adjustment layer, 197B: optical adjustment layer, 197G: optical adjustment layer, 201: transistor, 203: transistor, 204: connection portion, 205: transistor, 206: transistor, 207: transistor, 208: transistor, 209: transistor, 210: transistor, 211: insulating layer, 212: insulating layer, 213: insulating layer, 214: insulating layer, 214a: insulating layer, 214b: insulating layer, 215: insulating layer, 216: partition, 217: partition, 219a: light-blocking layer, 219*b*: spacer, 219*c*: sidewall, 220: gap, 221: conductive layer, 222*a*: conductive layer, 222*b*: conductive layer, 223: conductive layer, 225: insulating layer, 228: region, 230: region, 231: semiconductor layer, 231*i*: channel formation region, 231*n*: low-resistance region, 242: connection layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: information terminal, 9102: information terminal, 9200: information terminal, 9201: information terminal

The invention claimed is:

1. A display apparatus comprising a first pixel circuit, a second pixel circuit, a resin layer, a light-blocking layer, and a substrate,
   wherein the first pixel circuit comprises a light-receiving device, a first transistor, and a second transistor,
   wherein the second pixel circuit comprises a light-emitting device,
   wherein the light-receiving device comprises a first pixel electrode, an active layer, and a common electrode,
   wherein the light-emitting device comprises a second pixel electrode, a light-emitting layer, and the common electrode,
   wherein the active layer is positioned over the first pixel electrode,
   wherein the active layer comprises a first organic compound,
   wherein the light-emitting layer is positioned over the second pixel electrode,
   wherein the light-emitting layer comprises a second organic compound different from the first organic compound,
   wherein the common electrode comprises a portion overlapping with the first pixel electrode with the active layer therebetween and a portion overlapping with the second pixel electrode with the light-emitting layer therebetween,
   wherein the first transistor comprises polysilicon as a semiconductor layer,
   wherein the second transistor comprises a metal oxide as a semiconductor layer,
   wherein each of the resin layer and the light-blocking layer is positioned between the common electrode and the substrate,
   wherein the resin layer comprises an opening overlapping with the light-receiving device,
   wherein the resin layer comprises a portion overlapping with the light-emitting device, and
   wherein the light-blocking layer comprises a portion positioned between the common electrode and the resin layer.

2. The display apparatus according to claim 1, wherein the light-receiving device further comprises a common layer, wherein the common layer is positioned over the first pixel electrode and the second pixel electrode, and
   wherein the common layer comprises a portion overlapping with the active layer and a portion overlapping with the light-emitting layer.

3. The display apparatus according to claim 2, wherein the common layer comprises a layer serving as a hole-injection layer of the light-emitting device.

4. The display apparatus according to claim 2, wherein the common layer comprises a layer serving as a hole-transport layer of the light-emitting device.

5. The display apparatus according to claim 2, wherein the common layer comprises a layer serving as an electron-transport layer of the light-emitting device.

6. The display apparatus according to claim 2, wherein the common layer comprises a layer serving as an electron-injection layer of the light-emitting device.

7. The display apparatus according to claim 1,
   wherein the second pixel circuit further comprises a third transistor, and
   wherein the third transistor comprises polysilicon as a semiconductor layer.

8. The display apparatus according to claim 1,
   wherein the second pixel circuit further comprises a third transistor, and
   wherein the third transistor comprises a metal oxide as a semiconductor layer.

9. The display apparatus according to claim 1,
   wherein the light-blocking layer covers at least a part of the opening and at least a part of a side surface of the resin layer, which is exposed in the opening.

10. The display apparatus according to claim 1, further comprising an adhesive layer,
    wherein the adhesive layer is positioned between the common electrode and the substrate,
    wherein each of the resin layer and the light-blocking layer is positioned between the adhesive layer and the substrate,
    wherein the adhesive layer comprises a first portion overlapping with the light-receiving device and a second portion overlapping with the light-emitting device, and
    wherein the first portion is thicker than the second portion.

11. The display apparatus according to claim 1, wherein the display apparatus comprises flexibility.

12. A display module comprising the display apparatus according to claim 1, and a connector or an integrated circuit.

13. An electronic device comprising:
    the display module according to claim 12; and
    at least one of an antenna, a battery, a housing, a camera, a speaker, a microphone, and an operation button.

* * * * *